(12) United States Patent
Yoshioka et al.

(10) Patent No.: US 9,082,635 B2
(45) Date of Patent: Jul. 14, 2015

(54) WIRING METHOD, STRUCTURE HAVING WIRING PROVIDED ON SURFACE, SEMICONDUCTOR DEVICE, WIRING BOARD, MEMORY CARD, ELECTRIC DEVICE, MODULE AND MULTILAYER CIRCUIT BOARD

(75) Inventors: Shingo Yoshioka, Osaka (JP); Hiroaki Fujiwara, Nara (JP); Hiromitsu Takashita, Osaka (JP); Tsuyoshi Takeda, Osaka (JP); Yuko Konno, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 219 days.

(21) Appl. No.: 13/698,975

(22) PCT Filed: May 11, 2011

(86) PCT No.: PCT/JP2011/002628
§ 371 (c)(1),
(2), (4) Date: Nov. 20, 2012

(87) PCT Pub. No.: WO2011/145294
PCT Pub. Date: Nov. 24, 2011

(65) Prior Publication Data
US 2013/0056247 A1 Mar. 7, 2013

(30) Foreign Application Priority Data
May 19, 2010 (JP) .................. 2010-115250

(51) Int. Cl.
*H05K 1/11* (2006.01)
*H01L 25/065* (2006.01)
(Continued)

(52) U.S. Cl.
CPC ........ *H01L 25/0657* (2013.01); *C23C 18/1608* (2013.01); *C23C 18/1653* (2013.01);
(Continued)

(58) Field of Classification Search
CPC ....... H05K 1/111; H05K 1/112; H05K 1/141; H05K 1/144; H05K 1/182; H05K 3/368; H05K 3/3452; H05K 2221/10734; H01L 2224/16; H01L 2924/14; H01L 23/5384
USPC .......... 174/260, 261; 361/760, 761, 763, 764, 361/790, 792, 803
See application file for complete search history.

(56) References Cited

U.S. PATENT DOCUMENTS 5,284,691 A * 2/1994 Taniguchi et al. ........... 428/64.7
5,571,754 A * 11/1996 Bertin et al. .................. 438/109
(Continued)

FOREIGN PATENT DOCUMENTS

| JP | 2004-247706 A | 9/2004 |
| JP | 2005064446 A | 3/2005 |

(Continued)

OTHER PUBLICATIONS

Andy Tseng et al., "Advanced QFN Package for Low Cost and High Performance Solution", ICEP 2010 Proceedings, pp. 43-48.
(Continued)

*Primary Examiner* — Hoa C Nguyen
(74) *Attorney, Agent, or Firm* — McDermott Will & Emery LLP

(57) ABSTRACT

A wiring method is provided in which an insulating layer is formed on a surface of a semiconductor device 1 of which a plurality of connecting terminals are exposed, a resin film is formed on a surface of the insulating layer, a groove of a depth equal to or exceeding a thickness of the resin film is formed from a surface side of the resin film so that the groove passes in a vicinity of connecting terminals that are to be connected, and furthermore communicating holes which reach the connecting terminals to be connected from this portion that groove passes in the vicinity thereof are formed.

9 Claims, 13 Drawing Sheets

(51) Int. Cl.
    *H01L 21/48*     (2006.01)
    *H01L 21/683*     (2006.01)
    *H01L 23/495*     (2006.01)
    *H01L 23/498*     (2006.01)
    *H01L 23/538*     (2006.01)
    *H01L 23/00*     (2006.01)
    *H05K 3/18*     (2006.01)
    *H01L 25/00*     (2006.01)
    *H05K 1/18*     (2006.01)
    *C23C 18/16*     (2006.01)
    *C23C 18/18*     (2006.01)
    *H01L 23/31*     (2006.01)
    *H05K 3/28*     (2006.01)
    *H05K 3/46*     (2006.01)

(52) U.S. Cl.
    CPC ........ *C23C18/1893* (2013.01); *H01L 21/4832* (2013.01); *H01L 21/6835* (2013.01); *H01L 23/49541* (2013.01); *H01L 23/49827* (2013.01); *H01L 23/5389* (2013.01); *H01L 24/24* (2013.01); *H01L 24/25* (2013.01); *H01L 24/82* (2013.01); *H01L 25/50* (2013.01); *H05K 1/185* (2013.01); *H05K 3/184* (2013.01); *H01L 23/3121* (2013.01); *H01L 23/49582* (2013.01); *H01L 25/0655* (2013.01); *H01L 2221/68359* (2013.01); *H01L 2221/68377* (2013.01); *H01L 2224/24051* (2013.01); *H01L 2224/24137* (2013.01); *H01L 2224/24145* (2013.01); *H01L 2224/24146* (2013.01); *H01L 2224/24225* (2013.01); *H01L 2224/24226* (2013.01); *H01L 2224/24998* (2013.01); *H01L 2224/32145* (2013.01); *H01L 2224/82001* (2013.01); *H01L 2224/82039* (2013.01); *H01L 2224/82101* (2013.01); *H01L 2225/06524* (2013.01); *H01L 2225/06527* (2013.01); *H01L 2225/06551* (2013.01); *H01L 2225/06568* (2013.01); *H01L 2924/0102* (2013.01); *H01L 2924/0103* (2013.01); *H01L 2924/014* (2013.01); *H01L 2924/01005* (2013.01); *H01L 2924/01006* (2013.01); *H01L 2924/01012* (2013.01); *H01L 2924/01013* (2013.01); *H01L 2924/01019* (2013.01); *H01L 2924/01029* (2013.01); *H01L 2924/01033* (2013.01); *H01L 2924/01046* (2013.01); *H01L 2924/01047* (2013.01); *H01L 2924/01051* (2013.01); *H01L 2924/01056* (2013.01); *H01L 2924/01075* (2013.01); *H01L 2924/01078* (2013.01); *H01L 2924/01079* (2013.01); *H05K 3/284* (2013.01); *H05K 3/4644* (2013.01); *H05K 2201/10636* (2013.01); *H05K 2201/10674* (2013.01); *H05K 2203/0264* (2013.01); *H05K 2203/0769* (2013.01); *H05K 2203/1469* (2013.01)

(56) References Cited

U.S. PATENT DOCUMENTS

| | | | | |
|---|---|---|---|---|
| 5,699,234 | A | * | 12/1997 | Saia et al. ...................... 361/790 |
| 5,737,192 | A | * | 4/1998 | Linderman .................... 361/790 |
| 6,242,282 | B1 | * | 6/2001 | Fillion et al. .................. 438/106 |
| 6,472,747 | B2 | | 10/2002 | Bazarjani et al. |
| 6,535,398 | B1 | * | 3/2003 | Moresco ........................ 361/792 |
| 7,312,405 | B2 | * | 12/2007 | Hsu .............................. 174/262 |
| 7,733,662 | B2 | * | 6/2010 | Chen ............................. 361/761 |
| 8,008,781 | B2 | * | 8/2011 | Fillion et al. .................. 257/774 |
| 2002/0121679 | A1 | | 9/2002 | Bazarjani et al. |
| 2003/0043556 | A1 | * | 3/2003 | Sugimoto et al. ............. 361/760 |
| 2004/0159933 | A1 | | 8/2004 | Sunohara et al. |
| 2007/0222062 | A1 | | 9/2007 | Sunohara et al. |
| 2007/0224731 | A1 | | 9/2007 | Sunohara et al. |
| 2008/0099885 | A1 | * | 5/2008 | You et al. ...................... 257/659 |
| 2009/0272564 | A1 | | 11/2009 | Yoshioka et al. |

FOREIGN PATENT DOCUMENTS

| | | |
|---|---|---|
| JP | 2005108937 A | 4/2005 |
| JP | 2005332887 A | 12/2005 |
| JP | 2009152616 A | 7/2009 |
| JP | 2009158739 A | 7/2009 |
| JP | 2010050435 A | 3/2010 |

OTHER PUBLICATIONS

International Search Report issued on Jul. 19, 2011 in corresponding International Application No. PCT/JP2011/002628.

* cited by examiner

WIRING METHOD, STRUCTURE HAVING WIRING PROVIDED ON SURFACE, SEMICONDUCTOR DEVICE, WIRING BOARD, MEMORY CARD, ELECTRIC DEVICE, MODULE AND MULTILAYER CIRCUIT BOARD

RELATED APPLICATIONS

This application is the U.S. National Phase under 35 U.S.C. §371 of International Application No. PCT/JP2011/002628, filed on May 11, 2011, which claims priority to JP 2010-115250 filed on May 19, 2010, the disclosures of which Applications are incorporated by reference herein.

TECHNICAL FIELD

The present invention relates to a wiring method, and more particularly, to a wiring method for mutually connecting, by wiring, a plurality of parts to be connected which are exposed on a surface of a structure, a structure having wiring provided on a surface by this wiring method, a semiconductor device, a wiring board, a memory card, an electric device, a module and a multilayer circuit board.

BACKGROUND ART

In recent years, reduction of wiring width and narrowing of wiring pitch has advanced, as the density of wiring circuits in the electrical and electronic field has increased. However, the narrower the wiring pitch is, the greater the possibility of shorting or migration would be between adjacent wiring.

As technology for resolving this problem, Patent Document 1 discloses forming a swelling resin film on a surface of an insulating base material, forming grooves of a depth no less than the thickness of the film, from the outer surface of the swelling resin film, depositing catalytic metal on the surface of the grooves and the surface of the swelling resin film, and causing the swelling resin film to swell so as to detach from the surface of the insulating base material, and then forming an electroless plating film only on the portions where the catalytic metal remains.

According to this technology, it is possible to maintain an outline of the circuit pattern with high accuracy, and the occurrence of shorting and migration is suppressed. However, if a plurality of parts to be connected which are exposed on the surface of a structure are connected mutually by wiring, using the technology described in Patent Document 1, then the achievement of higher density of the wiring circuit is obstructed.

Furthermore, Non-Patent Document 1 describes using sealing resin to seal a semiconductor device which has been wire bonded by metal wires, or the like.

Patent Document 1: Japanese Patent Application Publication No. 2010-50435 (Paragraph 0014)

Non-Patent Document 1: Reference material accompanying lecture "Advanced QFN Package for Low Cost and High Performance Solution/Andy Tseng, Bernd Appelt, Yi-Shao Lai, Mark Lin, Bruce Hu, J W Chen, Sunny Lee" given May 12th 2010 at "ICEP 2010" held in Sapporo May 12th to 14th 2010.

SUMMARY OF THE INVENTION

It is an object of the present invention to avoid obstructing the achievement of higher density in a wiring circuit, when a plurality of parts to be connected which are exposed on the surface of a structure are mutually connected by wiring.

It is a further object of the present invention to suppress shorting, disconnection or damage of the wiring due to the pressure of sealing resin, when a structure is sealed with sealing resin.

One aspect of the present invention is a wiring method for mutually connecting by wiring a plurality of parts to be connected which are exposed on a surface of a structure, the method including: an insulating layer forming step of forming an insulating layer on a surface of the structure where the plurality of parts to be connected are exposed; and a wiring forming step of providing wiring having a main body section which is positioned on a surface of the insulating layer and a branch section which branches from the main body section, extends inside the insulating layer, and reaches a part to be connected of a connection object.

A further aspect of the present invention is a structure having wiring provided on a surface, wherein an insulating layer is formed on a surface of a structure in which a plurality of parts to be connected are exposed; a wiring main body section is provided on a surface of the insulating layer; a wiring branch section branches from the wiring main body section; and the wiring branch section extends inside the insulating layer and reaches a part to be connected of a connection object.

Yet a further aspect of the present invention is a semiconductor device, wherein an insulating layer is formed on a surface of a structure in which a semiconductor chip is mounted on an insulating base material and a connecting terminal provided on the insulating base material and a connecting terminal provided on the semiconductor chip are exposed; a wiring main body section is provided on a surface of the insulating layer; a wiring branch section branches from the wiring main body section; and the wiring branch section extends inside the insulating layer and reaches a connecting terminal of the insulating base layer and/or a connecting terminal of the semiconductor chip.

Yet a further aspect of the present invention is a wiring board, wherein an insulating layer is formed on a surface of a structure in which a semiconductor device is mounted on a printing wiring board and a connecting terminal provided on the printed wiring board and a connecting terminal provided on the semiconductor device are exposed; a wiring main body section is provided on a surface of the insulating layer; a wiring branch section branches from the wiring main body section; and the wiring branch section extends inside the insulating layer and reaches a connecting terminal of the printed wiring board and/or a connecting terminal of the semiconductor device.

Yet a further aspect of the present invention is a memory card, wherein an insulating layer is formed on a surface of a structure in which a memory package is mounted on a supporting body and a connecting terminal provided on the supporting body and a connecting terminal provided on the memory package are exposed; a wiring main body section is provided on a surface of the insulating layer; a wiring branch section branches from the wiring main body section; and the wiring branch section extends inside the insulating layer and reaches a connecting terminal of the supporting body and/or a connecting terminal of the memory package.

Yet a further aspect of the present invention is an electric device, wherein an insulating layer is formed on a surface of a structure in which a passive element is mounted on an insulating base material and a connecting terminal provided on the insulating base material and a connecting terminal provided on the passive element are exposed; a wiring main body section is provided on a surface of the insulating layer; a wiring branch section branches from the wiring main body section; and the wiring branch section extends inside the insulating layer and reaches a connecting terminal of the insulating base material and/or a connecting terminal of the passive element.

Yet a further aspect of the present invention is a module, wherein an insulating layer is formed on a surface of a structure in which an electric device is mounted on a supporting body and a connecting terminal provided on the supporting body and a connecting terminal provided on the electric device are exposed; a wiring main body section is provided on a surface of the insulating layer; a wiring branch section branches from the wiring main body section; and the wiring branch section extends inside the insulating layer and reaches a connecting terminal of the supporting body and/or a connecting terminal of the electric device.

Yet a further aspect of the present invention is a multilayer circuit board, wherein an insulating layer is formed on a surface of a structure in which a plurality of circuit boards are joined in a multi-level stacked state and connecting terminals provided on the circuit boards are exposed; a wiring main body section is provided on a surface of the insulating layer; a wiring branch section branches from the wiring main body section; the wiring branch section extends inside the insulating layer and reaches connecting terminals of respectively different circuit boards; and the connecting terminals of the circuit boards are end portions of internal circuits of the circuit boards.

Yet a further aspect of the present invention is a semiconductor device, wherein an insulating layer is formed on a surface of a structure in which a plurality of semiconductor chips are mounted in a multi-level stacked state on an insulating base material and connecting terminals provided on the circuit semiconductor chips are exposed; a wiring main body section is provided on a surface of the insulating layer; a wiring branch section branches from the wiring main body section; and the wiring branch section extends inside the insulating layer and reaches connecting terminals of respectively different semiconductor chips.

The aforementioned and further objects, characteristic features, aspects and advantages of the present invention will be more clearly understood from the following detailed description and the accompanying drawings.

DESCRIPTION OF EMBODIMENTS

Figure 15:
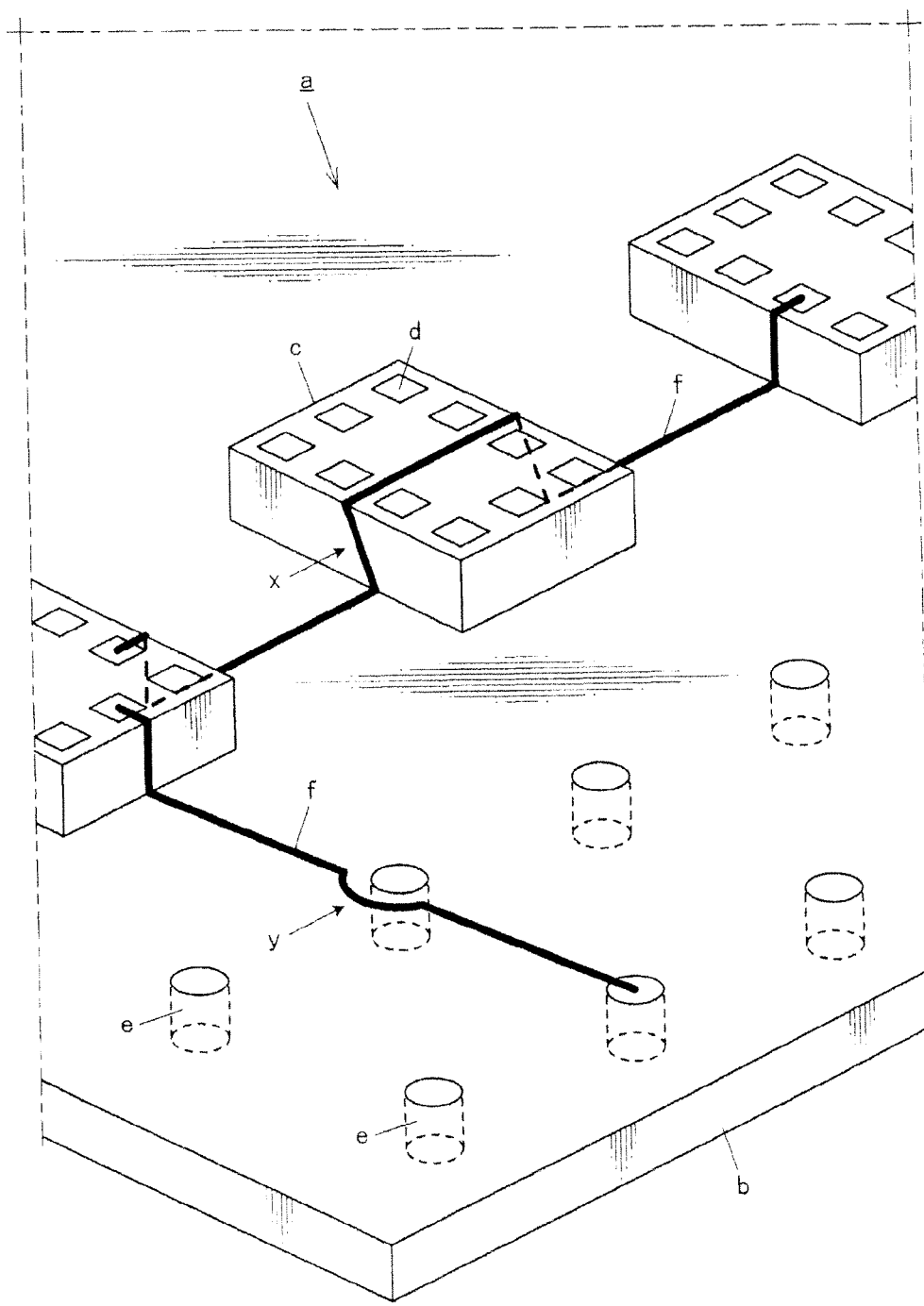
FIG. 15 is an illustrative diagram of problems relating to the prior art.

However, if a plurality of parts to be connected which are exposed on the surface of a structure are connected mutually by wiring, using the technology described in Patent Document 1, then problems of the following kind may occur. In FIG. 15, symbol a is a semiconductor device in which a semiconductor ship c is mounted on an insulating base material b, symbol d is a connecting terminal provided on the semiconductor chip c, symbol e is a connecting terminal provided in the insulating base material b, and symbol f is wiring which connects together connecting terminals d of the semiconductor chip c, or wiring which connects together a connecting terminal d of the semiconductor chip c and a connecting terminal e of the insulating base material b.

When the technology described in Patent Document 1 is used, the wiring f is provided on the surface of the insulating base material b and the surface of the semiconductor chip c. However, the connecting terminal e is exposed on the surface of the insulating base material b and the connecting terminal d is exposed on the surface of the semiconductor chip c. Therefore, if there is another connecting terminals d, e between the connecting terminals d, d or d, e that are to be mutually connected, then as indicated by the symbols x, y, the wiring f must be diverted so as to prevent the wiring f from making contact with the other connecting terminals d, e. This increases the wiring surface area and obstructs the achievement of higher density in the wiring circuit. The present invention was completed with the object of avoiding obstruction of the achievement of higher density in a wiring circuit, when a plurality of parts to be connected which are exposed on the surface of a structure are connected mutually by wiring.

Furthermore, when a semiconductor device which has been wire bonded using metal wires, or the like, is sealed with a sealing resin, the metal wires receive pressure from the sealing resin and a large load acts on the metal wires. As a result of this, shorting, disconnection or damage of the metal wires occurs and the productivity and reliability of the semiconductor device falls. It is a further object of the present invention to suppress shorting, disconnection or damage of the wiring due to the pressure of sealing resin, when a structure is sealed with sealing resin.

In the present specification, unless specified otherwise, "connecting terminal" means an electrode for electrical connection, a pad, bump, post, signal input terminal, signal output terminals, signal input/output terminal, extracted electrode, or the like, depending on the member on which it is provided.

Embodiments of the present invention are described below. The present invention is not limited to these embodiments.

<First Embodiment>

A wiring method relating to a first embodiment of the present invention is now described with reference to FIGS. 1A to 1F and FIGS. 2D to 2E. In FIGS. 1A to 1F and FIGS. 2D to 2E, reference numeral 1 is a structure on which a plurality of parts to be connected are exposed, reference numeral 10 is a semiconductor device, reference numeral 100 is a semiconductor device sealed with a sealing resin, reference numeral 101 is an insulating base material, reference numeral 101a is a connecting terminal of an insulating base material (part to be connected), reference numeral 102 is a semiconductor chip, reference numeral 102a is a connecting terminal of a semiconductor chip (part to be connected), reference numeral 103 is an insulating layer, reference numeral 104 is a resin film, reference numeral 105 is a groove, reference numerals 106, 107 are communicating holes, reference numeral 108 is wiring, reference numeral 108a is a wiring main body section, reference numeral 108b is a wiring branch section, reference numeral 108x is a plating catalyst, and reference numeral 109 is a sealing resin.

Below, a description of steps and a description of materials are given separately.

[Description of Steps]

Figure 1A:
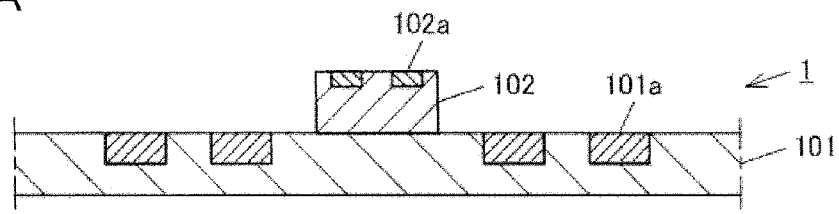
FIGS. 1A to 1F are step diagrams of a wiring method relating to a first embodiment of the present invention.

In the wiring method relating to the first embodiment, firstly, a structure 1 is prepared in which a semiconductor chip 102 is mounted on an insulating base material 101, as shown in FIG. 1A. The semiconductor chip 102 may be, for example, an IC, LSI, VLSI, LED chip, and the like. A plurality of connecting terminals 101a are provided on a surface of the insulating base material 101 and a plurality of connecting terminals 102a are provided on a surface of the semiconductor chip 102. These connecting terminals 101a, 102a are exposed on the surface of the structure 1.

Figure 1B:
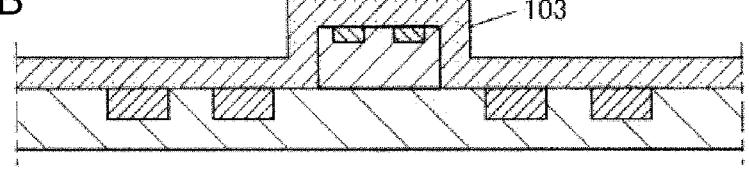

Next, as shown in FIG. 1B, an insulating layer 103 is formed on the surface of the structure 1 where the plurality of connecting terminals 101a, 102a are exposed (insulating layer forming step).

Figure 1C:
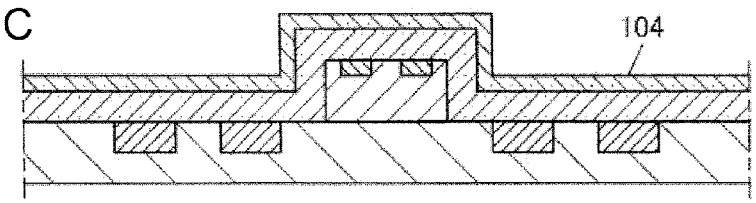

Thereupon, as shown in FIG. 1C, a resin film 104 is formed on the surface of the insulating layer 103 (resin film forming step).

Figure 1D:
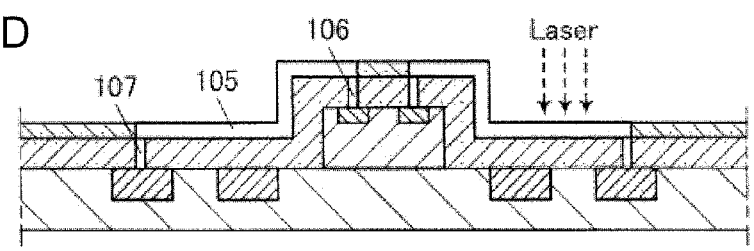
Figure 2D:
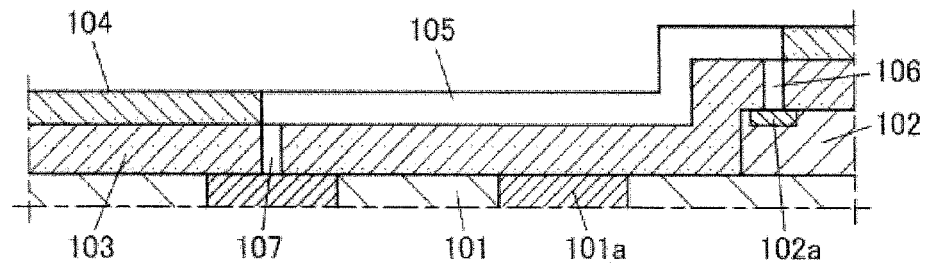
FIGS. 2D to 2E are more detailed step diagrams of a wiring forming step in the wiring method shown in FIGS. 1A to 1F.
Figure 2D:
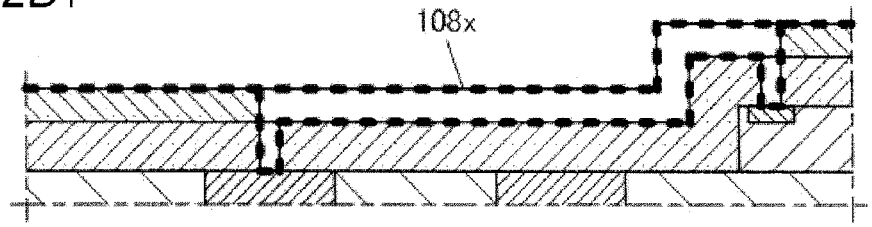
Figure 2D:
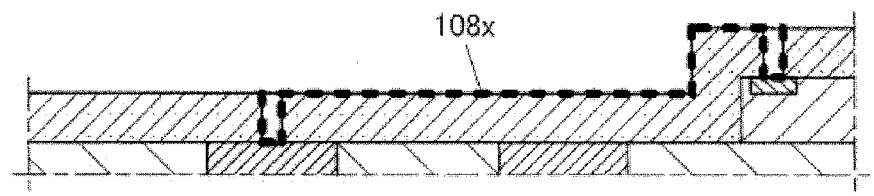

Next, as shown in FIG. 1D or FIG. 2D, a groove 105 of a depth which is equal to or exceeds the thickness of the resin film 104 from the surface side of the resin film 104 (the groove in the drawings is a groove of the same depth as the thickness of the resin film 104) is formed so as to pass in the vicinity of the connecting terminals 101a, 102a that are to be connected, in addition to which communicating holes 106, 107 which reach the connecting terminals 102a, 101a to be connected are formed from these portions passing in the vicinity of the connecting terminals 101a, 102a (groove and hole forming step). The formation of the groove 105 and the connecting holes 106, 107 is carried out by laser processing, or the like, for example.

Thereupon, as shown in FIG. $2D_1$, a plating catalyst 108x or a plating catalyst precursor is deposited on the surface of the groove 105 and the communicating holes 106, 107 (catalyst deposition step).

Subsequently, as shown in FIG. $2D_2$, the resin film 104 is removed by dissolving or swelling (resin film removal step).

Figure 1E:
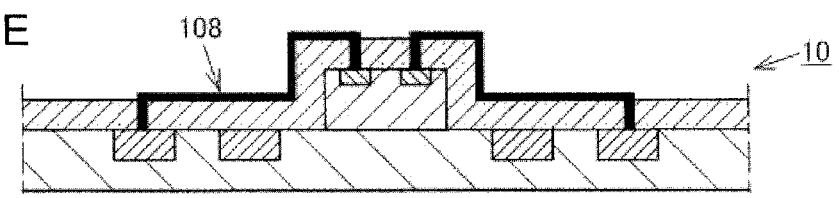
Figure 2E:
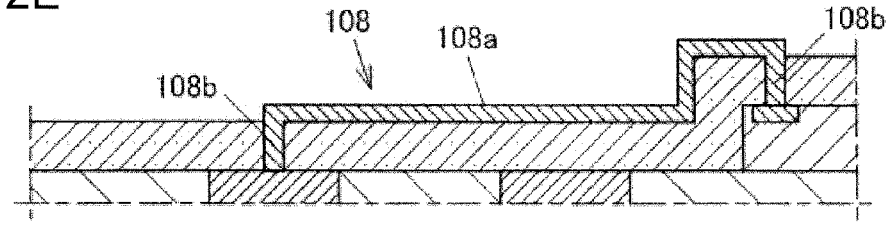

Next, as shown in FIG. 2E or FIG. 1E, a plating film is formed only on the portion where the plating catalyst 108x or a plating catalyst formed from the plating catalyst precursor is left by carrying out electroless plating (plating step). Consequently, wiring 108 is provided which includes a main body section 108a positioned on the surface of the insulating layer 103, and a branch section 108b which branches from the main body section 108a, extends inside the insulating layer 103 and reaches the connecting terminals 102a, 101a that are to be connected (wiring forming step).

According to aforementioned wiring forming step which includes a resin film forming step, a groove and hole forming step, a catalyst deposition step, a resin film removal step and a plating step of this kind, it is possible to maintain a highly accurate outline of the wiring 108, especially in the wiring main body section 108a, and the occurrence of shorting or migration is suppressed.

As a result, a semiconductor device (a structure having a wiring provided on a surface) 10 is obtained in which the semiconductor chip 102 is mounted on the insulating base material 101, and the connecting terminal 101a of the insulating base material 101 and the connecting terminal 102a of the semiconductor chip 102 are mutually connected by the wiring 108.

In the semiconductor device 10, an insulating layer 103 is formed on the surface of a structure 1 in which the connecting terminal 101a of the insulating base material 101 and the connecting terminal 102a of the semiconductor 102 are exposed, the main body section 108a of the wiring 108 is provided on the surface of this insulating layer 103, a branch section 108b of the wiring 108 branches from this wiring main body section 108a, and the wiring branch section 108b extends inside the insulating layer 103 and reaches the connecting terminals 101a of the insulating base material 101 and the connecting terminals 102a of the semiconductor chip 102.

Since the connecting terminals 101a and 102a are covered by the insulating layer 103, and the main body section 108a of the wiring 108 is provided on the surface of the insulating layer 103, then even if there are other connecting terminals 101a, 102a between the connecting terminals 101a, 102a that are to be connected to each other, it is not necessary to divert the wiring 108 so as to avoid contact with the other connecting terminals 101a, 102a. The wiring 108 can ride over, overlap with and pass the other connecting terminals 101a, 102a which are not to be connected. As a result of this, obstruction of the achievement of higher density of the wiring circuit is suppressed.

Figure 1F:
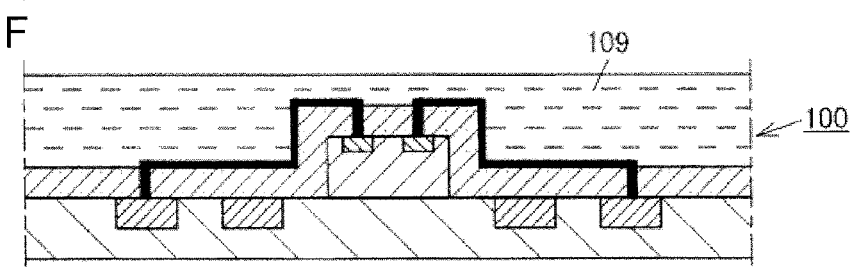

Next, as shown in FIG. 1F, the semiconductor device 10 is sealed with sealing resin 109. In this way, a semiconductor device 100 sealed with sealing resin 109 is achieved.

The wiring 108 is formed so as to lie flat against the surface of the insulating surface 103. Consequently, when the structure having a wiring 108 provided on the surface thereof (the semiconductor device 10) is inserted into a die and sealed with sealing resin 109, it is possible to prevent the wiring 108 from receiving pressure from the sealing resin 109 and hence receiving a large load. As a result of this, shorting, disconnection and damage of the wiring 108 is suppressed, and the productivity and reliability of the semiconductor device is improved, compared to a semiconductor device which is wire bonded by metal wires, or the like.

Depending on the circumstances, after the plating step and before sealing the semiconductor device 10 with sealing resin 109, it is desirable to thicken the plating layer by carrying out electroplating (electroplating step). A merit is obtained in that the time required to thicken the plating film can be shortened. More specifically, the electroless plating film can be thickened by electrically connecting the electroless plating film formed by the plating step to an anode side in an electroplating bath, and passing current between the film and a cathode side electrode.

There are no particular restrictions on the thickness of the plating film. More specifically, the thickness of the plating film is desirably 0.1 µm to 10 µm, and more desirably, 1 µm to 5 µm, for example.

Furthermore, desirably, depending on the circumstances, a fluorescent material is included in the resin film 104 and resin film 104 removal defects are inspected by using fluorescent light from the fluorescent material, after the resin film removal step and before the plating step (inspection step). If a resin film 104 on which the metal catalyst 108x or metal catalyst precursor has been deposited is left remaining between adjacent wiring 108, then a plating film is formed on this remaining portion and can become a cause of shorting. Therefore, by removing a portion where light emission is detected, a merit is obtained in that the formation of a plating film on this portion is suppressed and the occurrence of shorting can be prevented in advance.

There are no particular restrictions on the fluorescent material which may be included in the resin film 104, provided that it displays fluorescent properties when irradiated with light from a prescribed light source. More specifically, for instance, the fluorescent material may be fluorescein, eosin, pyronine G, etc.

[Description of Materials]
(Insulating Base Material)

The insulating base material 101 may employ organic base materials or inorganic base materials of various kinds, such as those conventionally used for mounting semiconductor chips, without any particular restrictions. Concrete examples of the organic base material are base materials such as: epoxy resin, acrylic resin, polycarbonate resin, polyimide resin, polyphenylene sulfide resin, polyphenylene ether resin, cyanate resin, benzoxazine resin, bismaleimide resin, and the like.

There are no particular restrictions on the epoxy resin, provided that the epoxy resin is one used to constitute various organic boards which may be used in the manufacture of a circuit board, for example. More specific examples include: bisphenol A type epoxy resin, bisphenol F type epoxy resin, bisphenol S type epoxy resin, aralkyl epoxy resin, phenol novolak type epoxy resin, alkyl phenol novolak type epoxy resin, biphenol type epoxy resin, naphthalene type epoxy resin, dicyclopentadiene type epoxy resin, epoxy compound of condensate of phenol and aromatic aldehyde containing phenolic hydroxyl group, triglycidyl isocyanurate, alicyclic epoxy resin, or the like. Moreover, in order to impart imflammability, the resin may be brominated or phosphorus-modified epoxy resin, nitrogen-containing resin, silicon-containing resin, or the like. These resins may be used either independently, or as a combination of two or more types.

When the insulating base material 101 is composed from these resins, a curing agent is generally used in order to cure the resin. There are no particular restrictions on the curing agent, but specific examples thereof are: dicyandiamide, a phenol type curing agent, acid anhydride type curing agent, amino triazine novolak curing agent, cyanate resin, or the like.

Possible examples of a phenol type curing agent are: novolac type, aralkyl type, terpene type, or the like. Moreover, in order to impart inflammability, possible examples are phosphorus-modified phenol resin, phosphorus-modified cyanate resin, and the like. These curing agents may be used either independently, or as a combination of two or more types.

In the groove and hole forming step, communicating holes 106, 107 are formed by laser processing, or the like, in the surface of the insulating base material 101 (if the depth of the groove 105 exceeds the thickness of the resin film 104, then a portion of the groove 105 is formed on the surface of the insulating base material 101), and therefore it is desirable to use a resin, or the like, which has excellent absorptivity of laser light (UV absorptivity) in the wavelength region from 100 nm to 400 nm, as the material of the insulating base material 101. A specific example of such a resin is polyimide resin, or the like.

The insulating base material 101 may also include a filler. There are no particular restrictions on the filler, for which it is possible to use inorganic micro-particles or organic micro-particles. When a filler is included, the filler is exposed in the portion that has been laser processed, and the adhesiveness between the insulating base material 101 and the plating film due to the undulations in the filler can be improved.

Specific examples of a material which constitutes the inorganic micro-particles are: a high-permittivity filler material, such as aluminum oxide ($Al_2O_3$), magnesium oxide (MgO), boron nitride (BN), aluminum nitride (AlN), silica ($SiO_2$), barium titanate ($BaTiO_3$), titanium oxide ($TiO_2$) or the like; a magnetic filler material such as hard ferrite, or the like; an inorganic flame retardant, such as magnesium hydroxide ($Mg(OH)_2$), aluminum hydroxide ($Al(OH)_2$), antimony trioxide ($Sb_2O_3$), antimony pentoxide ($Sb_2O_5$), guanidine salt, zinc borate, a molybdenum compound, zinc stannate, or the like; talc ($Mg_3(Si_4O_{10})(OH)_2$), barium sulphate ($BaSO_4$), calcium carbonate ($CaCO_3$), mica, or the like. These inorganic micro-particles may be used either independently, or as a combination of two or more types.

These inorganic micro-particles have high freedom in terms of thermal conductivity, relative permittivity, flame retarding properties, particle size distribution, color hue, and so on, and therefore it is possible to design the mixture ratio and particle size appropriately in order to selectively display desired functions, and to achieve high filling properties easily.

There are no particular restrictions on the average particle size of the filler, but desirably, the average particle size is 0.01 µm to 10 µm, and more desirably, 0.05 µm to 5 µm.

The inorganic micro-particles may have a surface treatment of a silane coupling agent in order to increase the dispersion in the insulating base material 101. Furthermore, the insulating base material 101 may include a silane coupling agent in order to increase dispersion of the inorganic micro-particles in the insulating base material 101. There are no particular restrictions on the silane coupling agent. More specific examples are silane coupling agents of epoxy silane type, mercapto silane type, amino silane type, vinyl silane type, styryl silane type, methacryloxy silane type, acryloxy silane type, titanate type, or the like. These silane coupling agents may be used either independently, or as a combination of two or more types.

Furthermore, the insulating base material 101 may include a dispersant in order to increase dispersion of the inorganic micro-particles in the insulating base material 101. There are no particular restrictions on the dispersant. Specific examples of the dispersant are, for example, alkyl ether type, sorbitan ester type, alkyl polyether amine type, polymer type, or the like. These dispersants may be used either independently, or as a combination of two or more types.

A specific example of organic micro-particles which can be used as a filler include rubber micro-particles, for example.

There are no particular restrictions on the embodiment of the insulating base material 101. Specifically, the insulating base material 101 may be a sheet, film, prepreg, or molded object having a three-dimensional shape, or the like. There are no particular restrictions on the thickness of the insulating base material 101. If the insulating base material 101 is in the form of a sheet, film or prepreg, or the like, for instance, then the thickness thereof is preferably 10 μm to 500 μm, more preferably, 10 μm to 200 μm, more preferably, 20 μm to 200 μm, and even more preferably, 20 μm to 100 μm.

The insulating base material 101 may be formed as a three-dimensional molded object, or the like, by introducing the material of the insulating base material into a die or frame mold, or the like, and then pressurizing and curing, or may be formed as a three-dimensional molded object, or the like, by curing a sheet, film or prepreg which has been punched and hollowed out, or by curing same through application of heat and pressure.

(Insulating Layer)

The insulating layer 103 may use an insulating organic material, such as resin, or an insulating inorganic material, such as ceramic, typically silica ($SiO_2$), or the like. It is also possible to use a material which is similar to the material that constitutes the insulating base material 101.

As shown in FIG. 1B, the method of forming the insulating layer 103 is not limited in particular, provided that it is a method whereby at least the insulating layer 103 is formed on the surface of the insulating base material 101 and the surface of the semiconductor chip 102. More specifically, for instance, possible methods are: a method in which a liquid material capable of forming an insulating layer 103 is applied to a surface of a structure 1 and then dried, or a method where a film formed by previously applying a liquid material to a supporting base material and drying is transferred or bonded to a surface of a structure 1. The method of applying liquid material is not limited in particular. More specifically, it is possible to employ a conventionally known method, such as spin coating, bar coating, dipping, spraying, or the like.

(Resin Film)

The method of forming the resin film 104 is not limited in particular, provided that it is a method whereby at least the resin film 104 is formed on the surface of the insulating layer 103, as shown in FIG. 1C. More specifically, for instance, possible methods are: a method in which a liquid material capable of forming the resin film 104 is applied over a surface of a structure 103 and then dried, or a method where a film formed by previously applying a liquid material to a supporting base material and drying is transferred or bonded to a surface of a structure 103. The method of applying liquid material is not limited in particular. More specifically, it is possible to employ a conventionally known method, such as spin coating, bar coating, dipping, spraying, or the like.

The thickness of the resin film 104 is preferably no more than 10 μm, and more preferably no more than 5 μm no less than 0.1 μm and more preferably, no less than 1 μm. If the thickness is too small, then the dimensional accuracy tends to decline, when the resin film 104 is removed partially by laser processing. Furthermore, if the thickness is too large, then it tends to become difficult to form a film of uniform thickness.

The material for forming the resin film 104 is not restricted in particular, provided that it is a resin material which can be removed by dissolving or can be removed by swelling in the resin film removal step. More specifically, for example, a resist resin used in the field of photoresist, or a resin which has a high rate of swelling with respect to a prescribed liquid and can be detached by swelling is employed.

Specific examples of a resist resin are light-curable epoxy resin, etching resist, polyester resin, rosin resin, or the like, for instance.

Furthermore, the swelling resin has a swelling rate with respect to the prescribed liquid of preferably no less than 50%, more preferably, no less than 100%, and even more preferably, no less than 500%. Specific examples of a resin of this kind are: a diene elastomer, such as a styrene-butadiene type copolymer, an acrylic elastomer, such as an acrylic acid ester type copolymer, and a polyester type elastomer, or the like, which has been adjusted to a desired swelling rate by adjusting the degree of cross-linking or gelation, or the like.

Additional and more detailed description of the resin film 104 is now given.

There are no particular restrictions on the resin film 104, provided that it can be removed in the resin film removal step. The resin film 104 is desirably a resin film that can easily be removed by dissolving or removed by detachment, from the surface of the insulating layer 103, by dissolving or swelling in a prescribed liquid. More specifically, the film is a film made from a dissolvable resin which can be dissolved readily by an organic solvent or alkaline solution, or a film made from a swellable resin which can be made to swell by a prescribed liquid (swelling liquid). The swellable resin film is not only a resin film which can be detached readily from the surface of the insulating layer 103 by swelling, without substantially dissolving in a prescribed liquid, and may also be a resin film which swells in a prescribed liquid, and at least a portion of which dissolves, the resin film being detached readily from the surface of the insulating layer 103 by this swelling and dissolving action, or a resin film which dissolves in the prescribed liquid and detaches readily from the surface of the insulating layer 103 due to this dissolution. By using a resin film of this kind, it is possible to remove the resin film 104 readily and satisfactorily from the surface of the insulating layer 103. If the resin film 104 is destroyed during the removal of the resin film 104, the plating catalyst 108x deposited on the resin film 104 is scattered, and there is a problem in that this scattered plating catalyst 108x becomes re-deposited on the insulating layer 103 and unwanted plating is formed in these portions. In the present embodiment, it is possible to remove the resin film 104, readily and satisfactorily, from the surface of the insulating layer 103, and the problems of this kind can be prevented in advance.

The material used for forming the resin film 104 is not restricted in particular, provided that it is a resin which can be removed readily by dissolving or detachment from the surface of the insulating layer 103, by dissolving or swelling in a prescribed liquid. Desirably, a resin having a swelling rate with respect to the prescribed liquid of no less than 50%, and more desirably, no less than 100%, and even more desirably, no less than 500% is used. If the swelling rate is too low, then the resin film tends to become difficult to detach.

The swelling rate (SW) of the resin film is determined from the weight before swelling m(b) and the weight after swelling m(a), using the formula "swelling rate $SW=\{(m(a)-m(b))/m(b)\}\times 100\%$".

The resin film 104 of this kind can be formed readily by a method of applying an elastomer suspension or emulsion onto the surface of the insulating layer 103 and then drying, or a method of applying an elastomer suspension or emulsion to a supporting base material and drying to form a film, and then transferring the film to the surface of an insulating layer 103.

A specific example of the elastomer is: a diene type elastomer, such as a styrene-butadiene copolymer, an acrylic type elastomer, such as an acrylic acid ester type copolymer, or a polyester type elastomer, or the like. Using an elastomer of this kind, it is possible readily to form a resin film having a desired swelling rate by adjusting the degree or cross-linking or the degree of gelation, or the like, of the elastomer resin particles which are dispersed as a suspension or an emulsion.

It is particularly desirable for the resin film 104 of this kind to be a resin in which the swelling rate changes in accordance with the pH of the swelling liquid. If using a film of this kind, by differentiating the liquid conditions in the catalyst deposition step and the liquid conditions in the resin film removal step, it is possible to detach and remove the resin film 104 readily from the insulating layer 103 at the pH of the resin film removal step, while maintaining a high adhesive force of the resin film 104 with respect to the insulating layer 103 at the pH of the catalyst deposition step.

More specifically, for instance, if the catalyst deposition step includes a step of processing in an acidic catalytic metal colloid solution in the range of pH 1 to 3, for example, and if the resin film removal step includes a step of causing the resin film to swell in an alkaline solution in a range of pH 12 to 14, for example, then the resin film 104 is desirably a resin film having a swelling rate with respect to the acidic catalytic metal colloid solution of no more than 60%, and more desirably, no more than 40%, and a swelling rate with respect to the alkaline solution of no less than 50%, more desirably, no less than 100% and even more desirably, no less than 500%.

Examples of a resin film 104 of this kind include: a sheet formed from an elastomer having a prescribed amount of a carboxyl group, or a sheet which is obtained by full surface curing of a light-curable alkaline development type of resist used as a dry film resist (hereinafter, abbreviated as "DFR") for patterning a printed wiring board, or a heat-curable or alkaline development type of sheet, and so on.

Specific examples of the elastomer having a carboxyl group include: a diene type elastomer, such as a styrene-butadiene type copolymer, or an acrylic elastomer such as an acrylic acid ester type copolymer, or a polyester type elastomer, which has a molecule containing a carboxyl group, by including a monomer unit having a carboxyl group as a copolymerization component. Using an elastomer of this kind, it is possible readily to form a resin film having a desired alkaline swelling rate by adjusting the acid equivalent, and the degree of cross-linking or gelation, and the like, of the elastomer which is dispersed as a suspension or an emulsion. Furthermore, it is also possible to increase the swelling rate with respect to the prescribed liquid which is used in the resin film removal step, and it is also possible readily to form a resin film which is dissolved by the liquid. The carboxyl group in the elastomer has an action of causing the resin film to swell in an aqueous alkaline solution, and detaching the resin film 104 from the surface of the insulating layer 103. Furthermore, the acid equivalent is the polymer molecular weight per carboxyl group.

Specific examples of the monomer unit having a carboxyl group are (meth)acrylic acid, fumaric acid, cinnamic acid, crotonic acid, itaconic acid, maleic acid anhydride, and the like.

The combination ratio of the carboxyl group in the elastomer having a carboxyl group of this kind is 100 to 2000 and more desirably, 100 to 800, as an acid equivalent. If the acid equivalent is too small (if the number of carboxyl groups is relatively too large), then the compatibility with the solvent or other constituent materials declines, and therefore the resistance of the electroless plating to the pre-processing liquid tends to decline. Furthermore, if the acid equivalent is too large (if the number of carboxyl groups is relatively too small), then the detachment properties in an aqueous alkaline solution tends to decline.

Moreover, the molecular weight of the elastomer is 10,000 to 1,000,000, and desirably, 20,000 to 500,000, and even more desirably, 20,000 to 60,000. If the molecular weight of the elastomer is too large, then the detachment properties tend to decline, and if the molecular weight is too small, then it is difficult to maintain a uniform thickness of the resin film since the viscosity declines, in addition to which the resistance of the electroless plating to the pre-processing liquid also declines.

Furthermore, for the DFR, it is possible to use a sheet of a light-curable resin composition which includes an acrylic resin, epoxy resin, styrene resin, phenol resin, urethane resin, or the like, having a prescribed amount of carboxyl groups, as a resin component, and also includes a photopolymerization initiator. To give specific examples of a DFR of this kind, there is a sheet obtained by full surface curing of a dry film of a photo-polymerizable resin composition such as that disclosed in Japanese Patent Application Publication No. 2000-231190, Japanese Patent Application Publication No. 2001-201851, or Japanese Patent Application Publication No. H11-212262, or a commercially available alkaline development type of DFR, such as the UFG series manufactured by Asahi Kasei Corporation.

Moreover, an example of a further resin film 104 is a resin which has rosin as a main component and contains a carboxyl group (for example, "NAZDAR 229" made by Yoshikawa Chemical Co., Ltd.), or a resin having phenol as a main component (for example, "104F" made by LEKTRACHEM Co., Ltd.).

The resin film 104 can be formed readily by applying a suspension or emulsion of a resin onto the surface of the insulating layer 103, using a conventionally known application method, such as a spin coating method or bar coating method, and then drying, or by bonding a DFR formed on a supporting base material onto the surface of the insulating layer 103, and then carrying out full surface curing.

Moreover, it is also desirable to use, as the resin film 104, a resin film of which the main component is a resin made of acrylic resin (a carboxyl group-containing acrylic resin) containing a carboxyl group having an acid equivalent of about 100 to 800, for example.

Furthermore, apart from the materials described above, compositions such as the following are also suitable for the resin film 104. More specifically, the characteristics required of the resist material which constitutes the resin film 104 are, for instance: (1) that it should have high resistance to the liquid in which structure 1 on which the resin film 104 is formed is immersed in the catalyst deposition step (this liquid being a chemical solution containing a plating catalyst); (2) that the resin film 104 should be readily removable by the resin film removal step, for instance, a step of immersing the structure 1 on which the resin film 104 is formed is an alkali; (3) that the film forming properties should be high; (4) that the film should be readily convertible into a dry film (DFR); and (5) that the storage properties should be high; and so on.

The chemical solution containing a plating catalyst is described hereinafter, but in the case of an acidic Pd—Sn colloidal catalyst system, it is always an acidic aqueous solution (having a pH of 1 to 3, for instance). Furthermore, in the case of an alkaline Pd ion catalyst system, the catalyst depositing activator is a weak alkali (pH 8 to 12), and other than this, the chemical solution is acidic. From the foregoing, the resin film 104 is required to have resistance to a chemical solution containing a plating catalyst, in a range from pH 1 to 11, and desirably, from pH 1 to 12. Having resistance to the chemical solution in this sense means that, when a test sample on which the resin film 104 had been deposited was immersed in the chemical solution, swelling or dissolution of the resin film 104 was sufficiently suppressed and hence the resin film 104 can function as a resist. Moreover, in general, the immersion temperature is room temperature to 60° C., the immersion time is 1 minute to 10 minutes, and the thickness of the resin film 104 approximately 1 μm to 10 μm, but the values are not limited to these. An alkali detachment chemical solution which is used in a resin film removal step is generally an aqueous NaOH solution or an aqueous sodium carbonate solution. Preferably, the resin film 104 can be removed easily when the pH of the solution is 11 to 14, and desirably, 12 to 14. In general, the concentration of the aqueous NaOH solution is approximately 1% to 10%, the processing temperature is room temperature to 50° C., the processing time is 1 minute to 10 minutes, and the solution is applied by immersion or spraying, but the invention is not limited to this. Since a resin film 104 is formed on the insulating layer 103, then good film forming properties are important. Uniform film forming properties without any pinholes, or the like, are required. Furthermore, if the film is formed as a dry film in order to simplify the manufacturing process and reduce material losses, and the like, then the film is also required to be bendable, in order to ensure good handling properties. Moreover, the resin film 104 which has been formed into a dry film on the insulating layer 103 is bonded by a laminator (roll or vacuum). The bonding temperature is between room temperature and 160° C. and the pressure and time are arbitrary. In this way, the viscosity during bonding is determined. Therefore, the resin film 104 which is converted into a dry film also serves to prevent the adherence of dirt, and is generally composed as a three-layer structure sandwiched between a carrier film and a cover film, but the resin film is not limited to this. With regard to the storage properties, desirably, storage at room temperature is possible, but storage by refrigeration or freezing must also be possible. It is also necessary to avoid separation of the dry film composition, or reduced bendability and fracturing of the dry film composition at low temperatures like this.

From the viewpoint described above, the resin film 104 may also be a polymer resin, or a resin composition containing a polymer resin, which is obtained by polymerizing (a) at least one type of monomer of carboxylic acid or acid anhydride having a molecule containing at least one polymerizable unsaturated group and (b) at least one type of monomer which can be polymerized with the monomer (a). Examples of commonly known technology are, for instance, Japanese Patent Application Publication No. H7-281437, Japanese Patent Application Publication No. 2000-231190, Japanese Patent Application Publication No. 2001-201851, and the like.

Examples of the monomer (a) are: a (meth)acrylic acid, fumaric acid, cinnaminic acid, crotonic acid, itaconic acid, maleic acid anhydride, maleic acid half ester, butyl acrylate, and the like, which can be used independently or as a combination of two or more types. The monomer (b) generally is non-acidic and has a molecule containing (one) polymerizable unsaturated group, but is not limited to this. The monomer (b) is chosen so as to maintain various properties such as the resistance to the catalyst deposition step, which is described below, and the flexibility of the cured film, and so on. Specific examples of the monomer (b) are: methyl(meth) acrylates, ethyl(meth)acrylates, iso-propyl(meth)acrylates, n-butyl(meth)acrylates, sec-butyl(meth)acrylates, tert-butyl (meth)acrylates, 2-hydroxyl ethyl(meth)acrylates and 2-hydroxyl propyl(meth)acrylates. Further examples are: vinyl alcohol esters, such as vinyl acetate, (meth)acrylonitrile, styrene or a polymerizable styrene derivative, or the like. It is also possible to obtain the monomer (b) by polymerization of only a carboxylic acid or acid anhydride having a molecule containing one of the aforementioned polymerizable unsaturated groups. Moreover, it is also possible to choose a monomer having a plurality of unsaturated groups, for the monomer used in the polymer, in such a manner that three-dimensional cross-linking can be achieved. Furthermore, it is also possible to introduce a reactive functional group, such as an epoxy group, hydroxyl group, amino group, amide group, vinyl group, or the like, in the molecular framework.

If a carboxyl group is contained in the resin, the amount of the carboxyl group contained in the resin should be 100 to 2000 and desirably 100 to 800, as an acid equivalent. If the acid equivalent is too low, then compatibility with the solvent or other constituents declines, and resistance to the plating pre-processing liquid also declines. If the acid equivalent is too high, then the detachment properties decline. Moreover, the compositional ratio of monomer (a) is desirably 5 mass % to 70 mass %.

In the resin composition, the aforementioned polymer resin is essential as a main resin (binder resin), and at least one of an oligomer, monomer, filler, or other additive may also be included. The main resin should be a linear type polymer having thermoplastic properties. The resin may also be grafted and branched in order to control the fluidity, crystalline properties, and the like. The molecular weight is approximately 1,000 to 500,000 in terms of the weight-average molecular weight, and is desirably 5,000 to 50,000. If the weight-average molecular weight is small, then the bendability of the film and the resistance to the chemical solution containing plating catalyst (acid resistance) decline. Furthermore, if the molecular weight is large, then there is deterioration in the alkaline detachment properties and the bonding properties when formed into a dry film. Moreover, it is also to possible to introduce cross-linking points in order to improve resistance to the chemical solution containing a plating catalyst and to suppress thermal deformation and control fluidity during laser processing.

Any monomer or oligomer may be used, provided that it has resistance to a chemical solution containing plating catalyst, and can be removed readily by an alkali. Furthermore, the monomer or oligomer may be used thermoplastically as an adhesiveness imparting material in order to improve the bonding properties of the dry film (DFR). Moreover, a cross-linking agent may be added in order to impart various resistances. Specific examples thereof are: methyl(meth)acrylates, ethyl(meth)acrylates, iso-propyl(meth)acrylates, n-butyl(meth)acrylates, sec-butyl(meth)acrylates, tert-butyl (meth)acrylates, 2-hydroxyl ethyl(meth)acrylates and 2-hydroxyl propyl(meth)acrylates. Further examples are: vinyl alcohol esters, such as vinyl acetate, (meth)acrylonitrile, styrene or a polymerizable styrene derivative, or the like. It is also possible to obtain the monomer by polymerization of only a carboxylic acid or acid anhydride having a molecule containing one of the aforementioned polymerizable unsaturated groups. Moreover, it is also possible to include a polyfunctional unsaturated compound. The monomer or oligomer may be the monomer described above or an oligomer which has been reacted with a monomer. Apart from the monomer described above, it is also possible to include two or more other photo-polymerizable monomers. Examples of such a monomer are: 1,6-hexane diol di(meth)acrylate, 1,4-cyclohexane diol di(meth)acrylate, or a polyoxy alkylene glycol di(meth)acrylate, such as polypropylene glycol di(meth) acrylate, polyethylene glycol di(meth)acrylate or polyoxyethylene polyoxypropylene glycol di(meth)acrylate, or 2-di-(p-hydroxy phenyl)propane di(meth)acrylate, glycerol tri (meth)acrylate, dipentaerithritol pena(meth)acrylate, trimethylol propane triglycidyl ether tri(meth)acrylate, bisphenol A diglycidyl ether tri(meth)acrylate, 2,2-bis(4-methacryloxy pentaethoxy phenyl)propane, polyfunctional (meth)acrylate containing a urethane group, or the like. The monomer or oligomer may be the monomer described above or an oligomer which has reacted with a monomer.

There are no particular restrictions on the filler, but possible examples are: silica, aluminum hydroxide, magnesium hydroxide, calcium carbonate, clay, kaolin, titanium oxide, barium sulphate, alumina, zinc oxide, talc, mica, glass, potassium titanate, wollastonite, magnesium sulphate, aluminum borate, organic filler, or the like. Moreover, a desirable thickness of the resist is a small thickness of 0.1 µm to 10 µm, and therefore a filler of small size is desirable. A filler having a small average particle size from which coarse particles have been removed should be used, but coarse particles can also be removed by crushing or filtering during dispersion.

Possible examples of other additives are: polymerizable resin (a photo-polymerization initiator), a polymerization inhibitor, a coloring agent (a dye, pigment, coloring pigment), a thermal polymerization initiator, an epoxy or urethane cross-linking agent, or the like.

In the groove and hole forming step, the resist film 104 is processed by laser, and the like, and therefore it is necessary to impart laser abrasion properties to the resist material (the material of the resin film 104). A carbon dioxide gas laser, an excimer laser, a UV-YAG laser, or the like, is selected as the laser processing device. These laser processing devices have different intrinsic wavelengths, and by selecting a material having high UV absorptivity with respect to this wavelength, it is possible to improve productivity. Of these, a UV-YAG laser is suited for fine processing, and since the laser wavelength is 355 nm at the third harmonic, or 266 nm at the fourth harmonic, then a desirable resist material is one having a relatively high UV absorptivity at these wavelengths. The higher the UV absorptivity, the cleaner the processing finish on the resin film 104 and the better the productivity. However, the invention is not limited to this and there may also be cases where it is preferable to choose a resist material having a relatively low UV absorptivity. The lower the UV absorptivity, the greater the amount of UV light transmitted by the resin film 104, and therefore UV energy can be concentrated on processing of the insulating layer 103 situated below the resin film, and an especially desirable result can be obtained if the insulating layer 103 is a material that is not readily processed, for instance. In this way, it is desirable to design the resist material in accordance with the laser processability of the resin film 104, the laser processability of the insulating layer 103, and the relationship between these, and so on.

In the resin film removal step, as shown in FIG. $2D_2$, it is possible to leave a plating catalyst 108$x$ only on the portion of the insulating layer 103 where the groove 105 and the communicating holes 106, 107 have been formed. On the other hand, as shown in FIG. $2D_1$ and FIG. $2D_2$, the plating catalyst 108$x$ deposited on the surface of the resin film 104 apart from the portion where the groove 105 has been formed in the groove and hole forming step is removed at the same time as the removal of the resin film 104.

The method for removing the resin film 104 by swelling or dissolving may be a method in which the resin film 104 is immersed for a prescribed period of time in a prescribed swelling liquid or dissolving liquid. Furthermore, in order to improve the detachment properties and the solubility, it is especially desirable to irradiate ultrasonic waves during immersion. In detachment by swelling, it is also possible to peel away the film by applying a light force, as necessary.

There are no particular restrictions on the liquid which dissolves or swells the resin film 104, provided that it is a liquid which can readily cause the resin film 104 to become detached by dissolving or swelling, without substantially decomposing or dissolving the insulating base material 101, the insulating layer 103, and the plating catalyst 108$x$. More specifically, if a light-curable epoxy resin is used as the resist resin, then a resist removing agent that is an organic solvent or an aqueous alkaline solution, or the like, is used. Furthermore, if the swelling resin used is an elastomer such as a diene type elastomer, an acrylic elastomer or a polyester type elastomer, it is desirable to use an aqueous alkaline solution, such as an aqueous sodium hydroxide solution having a concentration of approximately 1% to 10%, for example.

Furthermore, if the resin film 104 is a polymer resin, or a resin composition containing a polymer resin, which is obtained by polymerizing (a) at least one type of monomer of carboxylic acid or acid anhydride having a molecule containing at least one polymerizable unsaturated group and (b) at least one type of monomer which can be polymerized with the monomer (a), or if the resin film 104 is formed from an acrylic type resin containing a carboxyl group as described above, then it is desirable to use an aqueous alkaline solution, such as aqueous sodium hydroxide solution having a concentration of approximately 1% to 10%, for example, If a plating process which is processed under acidic conditions as described above is employed in the catalyst deposition step, then it is desirable that the resin film 104 should be either formed from an elastomer such as a diene elastomer, an acrylic elastomer and a polyester elastomer, for example, having a swelling rate of no more than 60% and desirably no more than 40% under acidic conditions and having a swelling rate of no less than 50% under alkaline conditions, or formed from a polymer resin or a resin composition including a polymer resin which is obtained by polymerizing (a) at least one type of monomer of carboxylic acid or acid anhydride having a molecule containing at least one polymerizable unsaturated group and (b) at least one type of monomer which can be polymerized with the monomer (a), or formed from an acrylic resin containing a carboxyl group as described above. The resin film of this kind is readily dissolved or caused to swell and then removed by dissolution or detachment, by being immersed, for instance, in an aqueous alkaline solution of pH 11 to 14, and desirably, pH 12 to 14, for example, an aqueous sodium hydroxide solution having a concentration of approximately 1% to 10%. It is also possible to irradiate ultrasonic waves during immersion, in order to raise the solubility or detachment properties. Furthermore, it is also possible to peel away the film by applying a light force, as necessary.

(Metal Catalyst)

The metal catalyst 108$x$ is a catalyst which is previously deposited in order to form an electroless plating film, only on a portion where it is wished to form an electroless plating film in the plating step. There are no particular restrictions on the plating catalyst 108$x$ that can be used, provided that it is a catalyst that is conventionally used for electroless plating. Moreover, it is also possible to deposit a plating catalyst pre-cursor instead of the plating catalyst 108$x$ and to generate a plating catalyst after removing the resin film 104. Specific examples of the plating catalyst 108$x$ include: metallic palladium (Pd), platinum (Pt), silver (Ag), and the like.

A possible method of depositing the plating catalyst 108$x$ includes a method of processing in an acidic solution after processing in an acidic Pd—Sn colloidal solution processing under acidic conditions of pH 1 to 3, for example. More specifically, there is the following method. Firstly, oil components adhering to the surfaces of the groove 105 and the communicating holes 106, 107 formed in the groove and hole forming step are hot washed with a surfactant solution (cleaner/conditioner), or the like. Thereupon, according to requirements, soft etching is carried out with a sodium persulfate-sulfuric acid type soft etching solution. Further acid washing is then carried out in an acidic solution, such as an aqueous sulfuric acid solution or an aqueous hydrochloric acid solution having a pH of 1 to 2. Next, tin(II) chloride is adsorbed by immersion in a pre-dip solution of which the main component is an aqueous solution of tin(II) chloride having a concentration of approximately 0.1%, or the like, whereupon Pd and Sn are aggregated and adsorbed by further immersion in an acidic catalytic metal colloid solution, such as an acidic Pd—Sn colloid of pH 1 to 3 which includes tin(II) chloride and palladium chloride. An oxidation reduction reaction ($SnCl_2+PdCl_2 \rightarrow SnCl_4+Pd\downarrow$) is generated between the adsorbed tin (II) chloride and the palladium chloride. By this means, metallic palladium (Pd), which is a plating catalyst $108x$, is precipitated.

It is possible to use a commonly known acidic Pd—Sn colloid catalyst solution, or the like, for the acidic catalytic metal colloid solution, and it is possible to employ a commercially available plating process which uses an acidic catalytic metal colloid solution. A process of this kind is systematized and marketed commercially by Rohm & Haas Electronic Materials Co., Ltd., for example.

By means of this catalyst deposition step, as shown in FIG. $2D_1$, a plating catalyst $108x$ is deposited on the surfaces of the groove 105 and communicating holes 106, 107, and the surface of the resin film 104.

(Electroless Plating)

For the method of electroless plating in the plating step, it is possible to use a method in which a structure 1 on which a plating catalyst $108x$ has been deposited is immersed in a tank of electroless plating liquid and an electroless plating film is precipitated only in the portion where the plating catalyst $108x$ has been deposited.

Possible examples of the metal which is used in the electroless plating include: copper (Cu), nickel (Ni), cobalt (Co), aluminum (Al), and the like. Of these, plating having Cu as a main component is desirable due to having excellent conductivity. Furthermore, a plating containing Ni is desirable due to having excellent corrosion resistance and close adhesion with solder.

By means of plating steps of this kind, as shown in FIG. $2D_2$ and FIG. 2E, an electroless plating film is precipitated only in the portion where the plating catalyst $108x$ is remaining on the surface of a path which links the connecting terminal $101a$ of the insulating base material 101 with the connecting terminal $102a$ of the semiconductor chip 102. Consequently, a wiring 108 is formed which includes a wiring main body section $108a$ positioned on the surface of the insulating layer 103, and a wiring branch section $108b$ which branches from the wiring main body section $108a$, extends inside the insulating layer 103 and reaches the connecting terminals $102a$, $101a$ that are to be connected, and the connecting terminals $102a$, $101a$ are connected to each other by this wiring 108.

The portion where the groove 105 was not formed in the groove and hole forming step was protected by the resin film 104 from the deposition of plating catalyst $108x$, and therefore an electroless plating film is not precipitated in this portion. Consequently, even if the wiring interval is narrow, an unnecessary plating film is not formed between mutually adjacent wiring, and problems such as shorting, are suppressed.

The respective materials described above which are used in the first embodiment are also used in the following embodiments, and therefore description of these materials is omitted in the embodiments described below.

<Second Embodiment>

A wiring method relating to a second embodiment of the present invention is now described with reference to FIGS. 3A to 3F. In FIGS. 3A to 3F, reference numeral 2 is a structure on which a plurality of parts to be connected are exposed, reference numeral 20 is a semiconductor device, reference numeral 200 is a semiconductor device sealed with a sealing resin, reference numeral 201 is an insulating base material, reference numeral $201a$ is a connecting terminal of an insulating base material (part to be connected), reference numeral 202 is a semiconductor chip, reference numeral $202a$ is a connecting terminal of a semiconductor chip (part to be connected), reference numeral 203 is an insulating layer, reference numeral 204 is a resin film, reference numeral 205 is a groove, reference numerals 206, 207 are communicating holes, reference numeral 208 is wiring, reference numeral $208a$ is a wiring main body section, reference numeral $208b$ is a wiring branch section, and reference numeral 209 is a sealing resin.

Figure 3A:
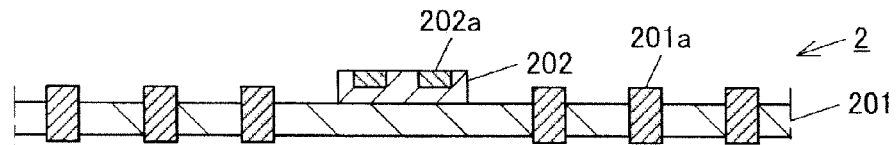
FIGS. 3A to 3F are step diagrams of a wiring method relating to a second embodiment of the present invention.

In the wiring method relating to the second embodiment, firstly, a structure 2 is prepared in which a semiconductor chip 202 is mounted on an insulating base material 201, as shown in FIG. 3A. A plurality of connecting terminals $201a$ are provided on a surface of the insulating base material 201 and a plurality of connecting terminals $202a$ are provided on a surface of the semiconductor chip 202. These connecting terminals $201a$, $202a$ are exposed on the surface of the structure 2.

The connecting terminal $201a$ of the insulating base material 201 projects from the surface of the insulating base material 201. Furthermore, the connecting terminal $201a$ also passes through the insulating base material 201 and projects from the opposite surface.

Figure 3B:
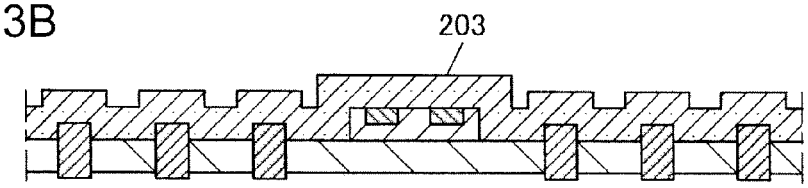

Next, as shown in FIG. 3B, an insulating layer 203 is formed on the surface of the structure 2 where the plurality of connecting terminals $201a$, $202a$ are exposed (insulating layer forming step). The surface of the insulating layer 203 has an undulating shape due to the fact that the connecting terminals $201a$ of the insulating base material 201 project from the surface of the insulating base material 201.

Figure 3C:
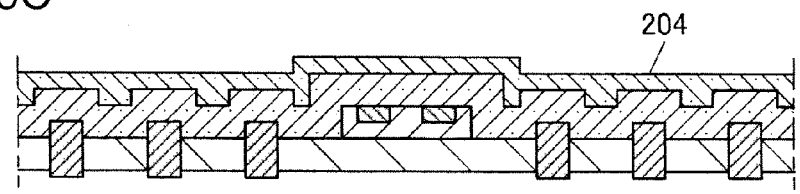

Next, as shown in FIG. 3C, a resin film 204 is formed on the surface of the insulating layer 203 (resin film forming step).

Figure 3D:
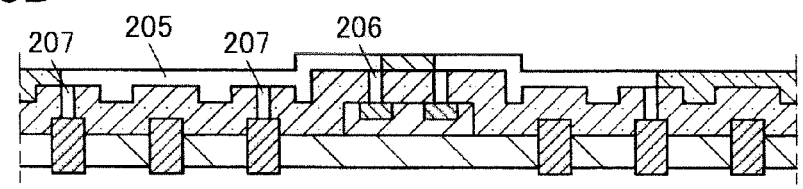

As shown in FIG. 3D, a groove 205 of a depth which is equal to or exceeds the thickness of the resin film 204 from the surface side of the resin film 204 (the groove in the drawings is a groove of the same depth as the thickness of the resin film 204) is formed so as to pass in the vicinity of the connecting terminals $201a$, $202a$ that are to be connected, in addition to which communicating holes 206, 207 which reach the connecting terminals $202a$, $201a$ to be connected are formed from these portions passing in the vicinity of the connecting terminals $202a$, $201a$ (groove and hole forming step).

Figure 3E:
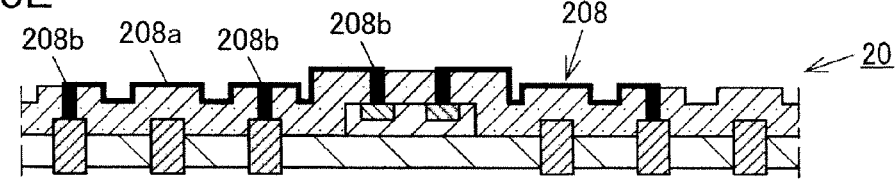

Similarly to the first embodiment, wiring 208 which includes a main body section $208a$ that is positioned on the surface of the insulating layer 203, and a branch section $208b$ that branches from the main body section $208a$, extends inside the insulating layer 203 and reaches the connecting terminals $202a$, $201a$ to be connected, is provided by carrying out a catalyst deposition step, a resin film removal step, and a plating step, as shown in FIG. 3E (wiring forming step).

According to a wiring forming step which includes a resin film forming step, a groove and hole forming step, a catalyst deposition step, a resin film removal step and a plating step of this kind, it is possible to maintain a highly accurate outline of the wiring 208, and in particular in the wiring main body section $208a$, and the occurrence of shorting or migration is suppressed.

In this, a semiconductor device (a structure having wiring provided on a surface) 20 is obtained in which the semiconductor chip 202 is mounted on the insulating base material 201, and the connecting terminal 201a of the insulating base material 201 and the connecting terminal 202a of the semiconductor chip 202 are mutually connected by the wiring 208.

In the semiconductor device 20, an insulating layer 203 is formed on the surface of a structure 2 in which the connecting terminal 201a of the insulating base material 201 and the connecting terminal 202a of the semiconductor chip 202 are exposed, the main body section 208a of the wiring 208 is provided on the surface of this insulating layer 203, a branch section 208b of the wiring 208 branches from this wiring main body section 208a, and the wiring branch section 208b extends inside the insulating layer 203 and reaches the connecting terminals 201a of the insulating base material 201 and the connecting terminals 202a of the semiconductor chip 202.

Since the connecting terminals 201a, 202a are covered by the insulating layer 203, and the main body section 208a of the wiring 208 is provided on the surface of the insulating layer 203, then even if there are other connecting terminals 201a, 202a between the connecting terminals 201a, 202a that are to be connected to each other, it is not necessary to divert the wiring 208 so as to avoid contact with the other connecting terminals 201a, 202a. The wiring 208 can ride over, overlap with and pass the other connecting terminals 201a, 202a which are not to be connected. As a result of this, obstruction of the achievement of higher density of the wiring circuit is suppressed.

Figure 3F:
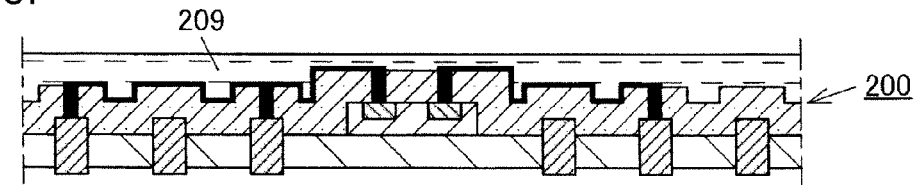

Next, as shown in FIG. 3F, the semiconductor device 20 is sealed with sealing resin 209. In this way, a semiconductor device 200 sealed with sealing resin 209 is achieved.

The wiring 208 is formed so as to lie flat against the surface of the insulating surface 203. Consequently, when the structure having wiring 208 provided on the surface thereof (the semiconductor device 20) is inserted into a die and sealed with sealing resin 209, it is possible to prevent the wiring 208 from receiving pressure from the sealing resin 209 and hence receiving a large load. As a result of this, shorting, disconnection and damage of the wiring 208 is suppressed, and the productivity and reliability of the semiconductor device is improved, compared to a semiconductor device which is wire bonded by metal wires, or the like.

<Third Embodiment>

A wiring method relating to a third embodiment of the present invention is now described with reference to FIGS. 4A to 4I. In FIGS. 4A to 4I, reference numeral 3 is a structure in which a plurality of parts to be connected are exposed, reference numeral 30 is a structure having wiring provided on a surface, reference numeral 300 is a structure having wiring provided on a surface, which is sealed with sealing resin, reference numeral 301 is a copper plate, reference numeral 301a is a connecting terminal (connected part), reference numeral 302 is resist, reference numeral 303 is a metal plating film provided via a nickel plating, reference numeral 304 is a cavity, reference numeral 305 is a semiconductor chip, reference numeral 305a is a connecting terminal of a semiconductor chip (connected part), reference numeral 306 is an insulating layer, reference numeral 307 is a resin film, reference numeral 308 is wiring, reference numeral 308a is a wiring main body section, reference numeral 308b is a wiring branch section, and reference numeral 309 is a sealing resin.

Figure 4A:
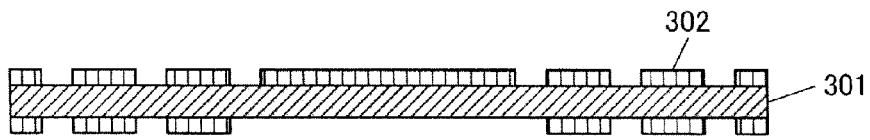
FIGS. 4A to 4I are step diagrams of a wiring method relating to a third embodiment of the present invention.

In the wiring method relating to the third embodiment, firstly, as shown in FIG. 4A, a resist 302 is arranged on a surface and an opposite surface of a copper plate 301.

Figure 4B:
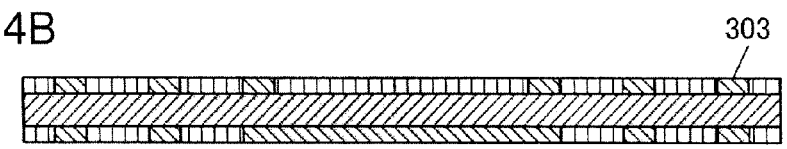

Next, as shown in FIG. 4B, a metal plating film 303 provided via a nickel plating is formed on the portions of the surface and the opposite surface of the copper plate 301 where the resist 302 is arranged.

Figure 4C:

Next, the resist 302 is removed, as shown in FIG. 4C.

Figure 4D:
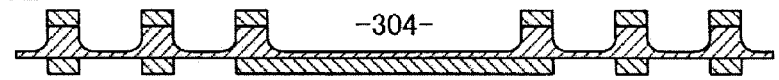

Thereupon, as shown in FIG. 4D, the portion of the surface of the copper plate 301 apart from the portion where the metal plating film 303 has been formed is half-etched to form a recess section. Here, one recess section forms a cavity 304.

Figure 4E:
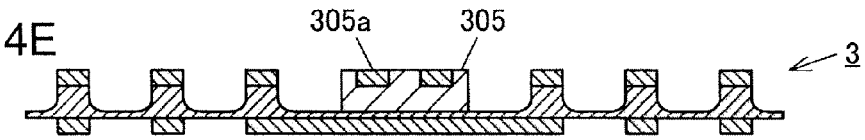

Then, as shown in FIG. 4E, a semiconductor chip 305 is mounted in the cavity 304.

At this stage, a structure 3 in which the plurality of connecting terminals 301a, 305a are exposed is obtained.

Figure 4F:
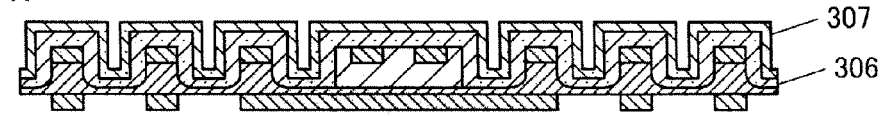

Next, as shown in FIG. 4F, an insulating layer 306 is formed on the surface of the structure 3 where the plurality of connecting terminals 301a, 305a are exposed (insulating layer forming step). The surface of the insulating layer 306 has an undulating shape due to the presence of the projecting connecting terminals 301a.

Thereupon, as shown in FIG. 4F, a resin film 307 is formed on the surface of the insulating layer 306 (resin film forming step).

Figure 4G:
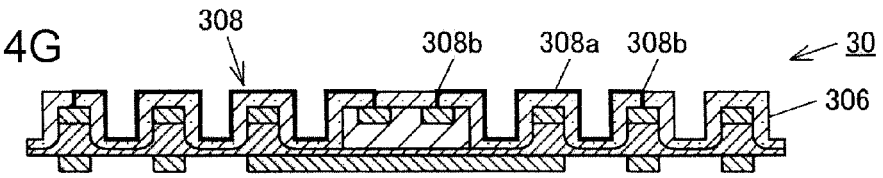

Similarly to the first embodiment, wiring 308 which includes a main body section 308a that is positioned on the surface of the insulating layer 306, and a branch section 308b that branches from the main body section 308a, extends inside the insulating layer 306 and reaches the connecting terminals 301a, 305a to be connected, is provided by carrying out a groove and hole forming step, a catalyst deposition step, a resin film removal step, and a plating step, as shown in FIG. 4G (wiring forming step).

The connecting terminals 301a and the connecting terminals 305a of the semiconductor chip 305 are mutually connected by the wiring 308, and a structure 30 having wiring 308 provided on a surface is obtained.

In this structure 30, an insulating layer 306 is formed on the surface of a structure 3 in which the plurality of connecting terminals 301a, 305a are exposed, the main body section 308a of the wiring 308 is provided on the surface of this insulating layer 306, a branch section 308b of the wiring 308 branches from this wiring main body section 308a, and the wiring branch section 308b extends inside the insulating layer 306 and reaches connection targets—the connecting terminals 301a and the connecting terminals 305a of the semiconductor chip 305.

Since the connecting terminals 301a, 305a are covered by the insulating layer 306, and the main body section 308a of the wiring 308 is provided on the surface of the insulating layer 306, then even if there are other connecting terminals 301a, 305a between the connecting terminals 301a, 305a that are to be mutually connected, it is not necessary to divert the wiring 308 so as to avoid contact with the other connecting terminals 301a, 305a. The wiring 308 can ride over, overlap with and pass the other connecting terminals 301a, 305a which are not to be connected. As a result of this, obstruction of the achievement of higher density of the wiring circuit is suppressed.

Figure 4H:
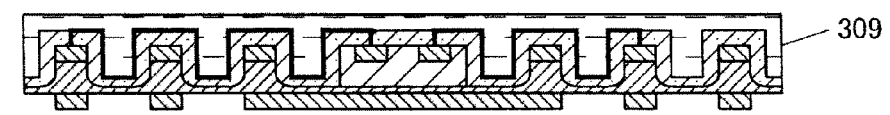

Next, as shown in FIG. 4H, the structure 30 is sealed with sealing resin 309.

Figure 4I:
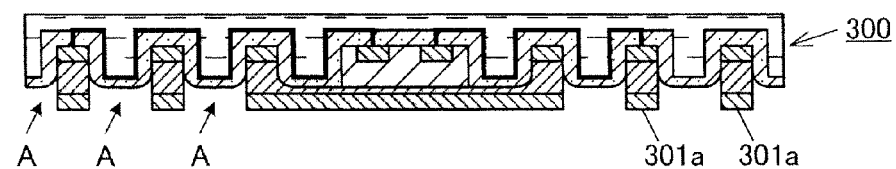

Thereupon, as shown in FIG. 4I, the copper plate 301 remaining between the connecting terminals 301a and between the connecting terminal 301a and the cavity 304 is removed by etching (reference symbol A). The connecting terminals 301a and the cavities 304 are joined together by the insulating layer 306 and the sealing resin 309, and therefore are not scattered about even when the copper plate 301 is removed.

In this way, a structure 300 having wiring 308 provided on a surface which is sealed with a sealing resin 309 is obtained.

The wiring 308 is formed so as to lie flat against the surface of the insulating surface 306. Consequently, when the structure 30 having a wiring 308 provided on the surface thereof is inserted into a die and sealed with sealing resin 309, it is possible to prevent the wiring 308 from receiving pressure from the sealing resin 309 and hence receiving a large load. As a result of this, shorting, disconnection and damage of the wiring 308 is suppressed, and the productivity and reliability of the structure is improved, compared to a structure which is wire bonded by metal wires, or the like.

The portion of the metal which constitutes the cavity 304 functions as a heat radiating plate of a semiconductor chip 305.

Furthermore, the connecting terminal 301a is ultimately constituted by the copper plate 301 and the metal plating film 303 on either end portion.

<Fourth Embodiment>

A wiring method relating to a fourth embodiment of the present invention is now described with reference to FIGS. 5A to 5I. However, constituent elements which are the same as or equivalent to those of the third embodiment are labeled with the same reference numerals as the third embodiment, and only portions which are different to the third embodiment are described. In the drawings, reference numeral 302a is a supporting plate.

Figure 5A:
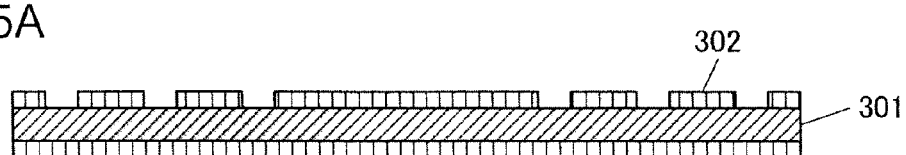
FIGS. 5A to 5I are step diagrams of a wiring method relating to a fourth embodiment of the present invention.

In the wiring method relating to the fourth embodiment, firstly, as shown in FIG. 5A, a resist 302 is arranged on a surface of a copper plate 301 and a supporting plate 302a is bonded to an opposite surface of the copper plate 301.

Figure 5B:
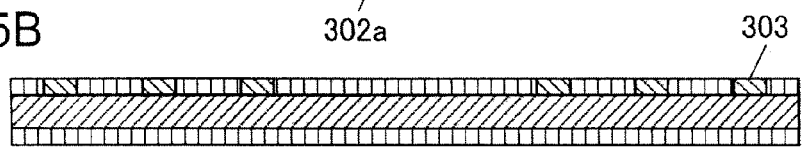
Figure 5C:
Figure 5D:
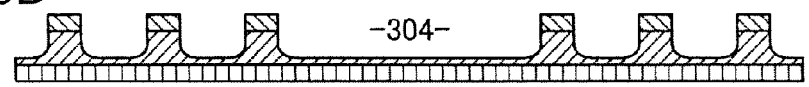
Figure 5E:
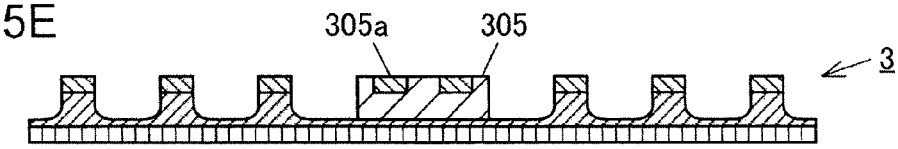
Figure 5F:
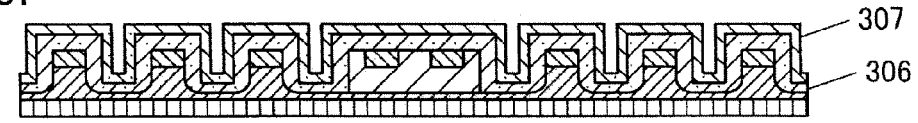
Figure 5G:
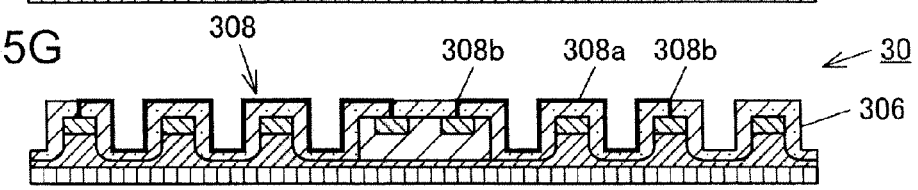
Figure 5H:
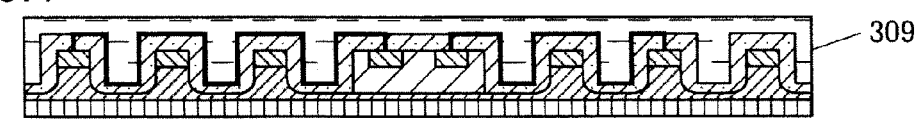

Thereupon, as shown in FIG. 5B, a metal plating film 303 is formed via a nickel plating on the portion of the surface of the copper plate 301 apart from the portion where the resist 302 has arranged.

FIGS. 5C to 5H are similar to FIGS. 4C to 4H relating to the third embodiment.

Therefore, since connecting terminals 301a, 305a are covered by an insulating layer 306, and a main body section 308a of wiring 308 is provided on the surface of the insulating layer 306, then even if there are other connecting terminals 301a, 305a between the connecting terminals 301a, 305a that are to be mutually connected, it is not necessary to divert the wiring 308 so as to avoid contact with the other connecting terminals 301a, 305a. The wiring 308 can ride over, overlap with and pass the other connecting terminals 301a, 305a which are not to be connected. As a result of this, obstruction of the achievement of higher density of the wiring circuit is suppressed.

Figure 5I:
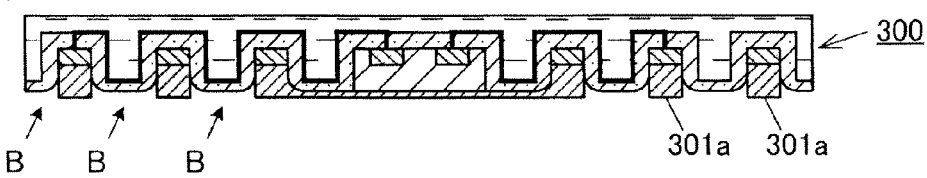

Next, as shown in FIG. 5I, a supporting plate 302a is removed, whereupon the copper plate 301 remaining between the connecting terminals 301a and the cavities 304 is removed by etching (reference symbol B).

In this way, a structure 300 having wiring 308 provided on a surface which is sealed with a sealing resin 309 is obtained.

The wiring 308 is formed so as to lie flat against the surface of the insulating surface 306. Consequently, when the structure 30 having a wiring 308 provided on a surface thereof is inserted into a die and sealed with sealing resin 309, it is possible to prevent the wiring 308 from receiving pressure from the sealing resin 309 and hence receiving a large load. As a result of this, shorting, disconnection and damage of the wiring 308 is suppressed, and the productivity and reliability of the structure is improved, compared to a structure which is wire bonded by metal wires, or the like.

Since a metal plating film 303 is not formed on the opposite surface of the copper plate 301, then costs are reduced in comparison with the third embodiment.

Furthermore, since the supporting plate 302a remains throughout in a bonded state on the opposite surface of the copper plate 301, as shown by FIGS. 5A to 5H, the work piece is supported securely during the operation.

<Fifth Embodiment>

Figure 6:
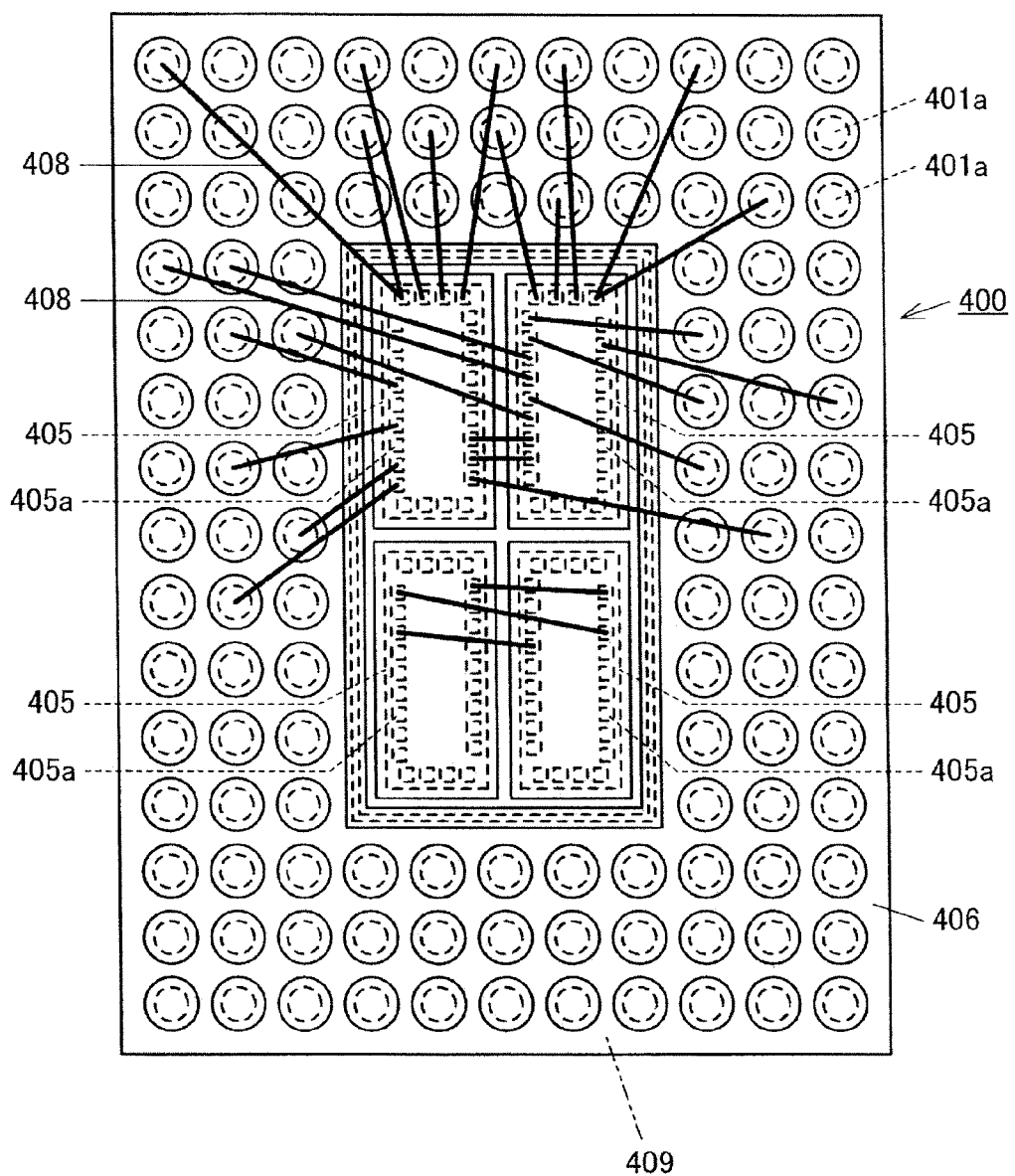
FIG. 6 is a plan diagram of a semiconductor device relating to a fifth embodiment of the present invention.

A wiring method relating to a fifth embodiment of the present invention is now described with reference to FIG. 6. Reference numeral 400 is a semiconductor device which is sealed in a sealing resin 409, reference numeral 401a is a connecting terminal of an insulating base material (part to be connected), reference numeral 405 is a semiconductor chip, reference numeral 405a is a connecting terminal of a semiconductor chip (part to be connected), reference numeral 406 is an insulating layer, reference numeral 408 is wiring, and reference numeral 409 is a sealing resin. The sealing resin 409 is taken to have been removed and is not depicted. Furthermore, only a portion of the wiring 408 is depicted.

The semiconductor device 400 relating to the fifth embodiment has a similar composition to the semiconductor devices 100, 200 obtained in the first embodiment or the second embodiment, and the structure 300 obtained in the third embodiment or the fourth embodiment. More specifically, in the semiconductor device 400 relating to the fifth embodiment, an insulating layer 406 is formed on a surface of a structure in which a semiconductor chip 405 is mounted on an insulating base material, and connecting terminals 401a provided on the insulating base material and connecting terminals 405a provided on the semiconductor chip 405 are exposed, and main body sections of wiring 408 are provided on a surface of this insulating layer 406, branch sections of the wiring 408 branch from these wiring main sections, and these branch sections extend inside the insulating layer 406 and reach the connecting terminals 401a of the insulating base material and/or the connecting terminals 405a of the semiconductor chip 405.

The surface of the insulating layer 406 has an undulating shape, due to the fact that the connecting terminals 401a project beyond the surface of the insulating base material and also due to the fact that the semiconductor chip 405 is mounted on the insulating base material.

Since the connecting terminals 401a, 405a are covered by the insulating layer 406, and the main body sections of the wiring 408 are provided on the surface of the insulating layer 406, then even if there are other connecting terminals 401a, 405a between the target connecting terminals 401a and 405a or 405a and 405a that are to be mutually connected, it is not necessary to divert the wiring 408 so as to avoid contact with the other connecting terminals 401a, 405a. The wiring 408 can ride over, overlap with and pass the other connecting terminals 401a, 405a which are not to be connected. As a result of this, obstruction of the achievement of higher density of the wiring circuit is suppressed.

Furthermore, the wiring 408 is formed so as to lie flat against the surface of the insulating surface 406. Consequently, when the structure having wiring 408 provided on a surface thereof (the semiconductor device 400) is inserted into a die and sealed with sealing resin 409, it is possible to prevent the wiring 408 from receiving pressure from the sealing resin 409 and hence receiving a large load. As a result of this, shorting, disconnection and damage of the wiring 408 is suppressed, and the productivity and reliability of the semiconductor device is improved, compared to a semiconductor device which is wire bonded by metal wires, or the like.

In the illustration, the wirings 408 are depicted as not intersecting with each other, but depending on the circumstances, there are also cases where the wirings 408 may intersect other without any problem (for example, when transmitting a pulse signal, or the like).

<Sixth Embodiment>

A wiring method relating to a sixth embodiment of the present invention is now described with reference to FIG. 7. The reference numeral 500 is a semiconductor device which is sealed in a sealing resin, reference numeral 501a is a connecting terminal of an insulating base material (part to be connected), reference numeral 505 is a semiconductor chip, reference numeral 505a is a connecting terminal of a semiconductor chip (part to be connected), reference numeral 506 is an insulating layer, reference numeral 508 is wiring, reference numeral 508a wiring main body section and reference numeral 508b is a wiring branch section. The sealing resin is taken to have been removed and is not depicted. Furthermore, only a portion of the wiring 508 is depicted.

The semiconductor device 500 relating to the sixth embodiment has a similar composition to the semiconductor devices 100, 200 obtained in the first embodiment or the second embodiment, and the structure 300 obtained in the third embodiment or the fourth embodiment. More specifically, in the semiconductor device 500 relating to the sixth embodiment, an insulating layer 506 is formed on a surface of a structure in which a semiconductor chip 505 is installed on an insulating base material, and connecting terminals 501a provided on the insulating base material and connecting terminals 505a provided on the semiconductor chip 505 are exposed, and main body sections 508a of wiring 508 are provided on a surface of this insulating layer 506, branch sections 508b of the wiring 508 branch from these wiring main body sections 508a, and these wiring branch sections 508b extend inside the insulating layer 506 and reach the connecting terminals 501a of the insulating base material and/or the connecting terminals 505a of the semiconductor chip 505.

The surface of the insulating layer 506 has an undulating shape, due to the fact that the connecting terminals 501a project beyond the surface of the insulating base material and also due to the fact that the semiconductor chip 505 is mounted on the insulating base material.

Since the connecting terminals 501a, 505a are covered by the insulating layer 506, and the main body sections 508a of the wiring 508 are provided on the surface of the insulating layer 506, then even if there are other connecting terminals 501a, 505a between the target connecting terminals 501a and 505a or 505a and 505a that are to be mutually connected, it is not necessary to divert the wiring 508 so as to avoid contact with the other connecting terminals 501a, 505a. The wiring 508 can ride over, overlap with and pass the other connecting terminals 501a, 505a which are not to be connected. As a result of this, obstruction of the achievement of higher density of the wiring circuit is suppressed.

Furthermore, the wiring 508 is formed so as to lie flat against the surface of the insulating surface 506. Consequently, when the structure having wiring 508 provided on a surface thereof (the semiconductor device 500) is inserted into a die and sealed with sealing resin, it is possible to prevent the wiring 508 from receiving pressure from the sealing resin and hence receiving a large load. As a result of this, shorting, disconnection and damage of the wiring 508 is suppressed, and the productivity and reliability of the semiconductor device is improved, compared to a semiconductor device which is wire bonded by metal wires, or the like.

In the illustration, wirings 508 are depicted as not intersecting with each other, but depending on the circumstances, there are also cases where wirings 508 may intersect with each other without any problem (for example, when transmitting a pulse signal, or the like).

Figure 7:
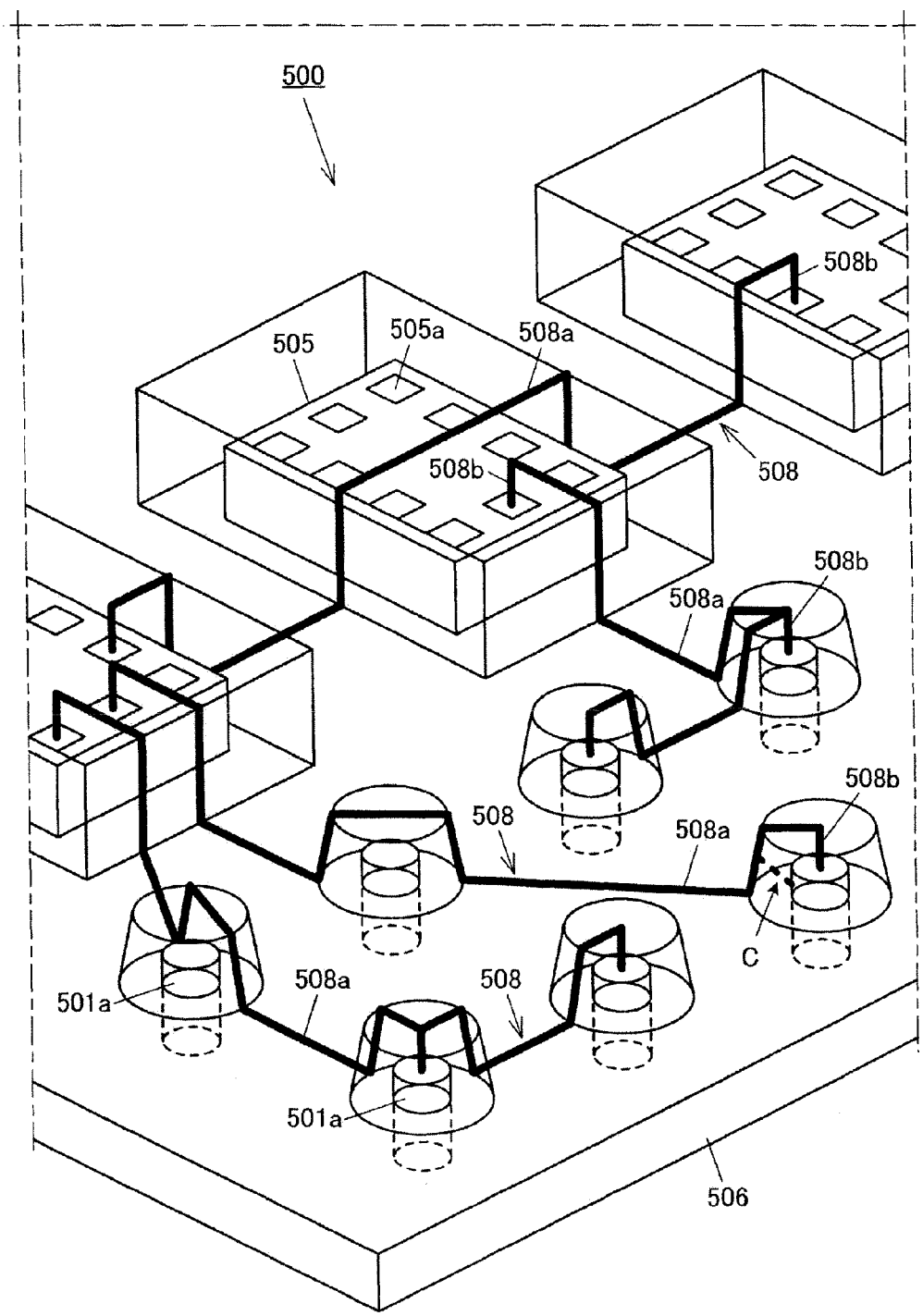
FIG. 7 is a partial transparent perspective diagram of a semiconductor device relating to a sixth embodiment of the present invention.

Furthermore, as indicated by reference symbol C in FIG. 7, the wiring branch sections 508b do not have to reach the connecting terminals 501a, 505a vertically from directly above, and depending on the shape of the surface of the insulating layer 506, may reach the connecting terminals 501a, 505a obliquely from above or horizontally from the side.

<Seventh Embodiment>

A wiring method relating to a seventh embodiment of the present invention is now described with reference to FIGS. 8A to 8H. In FIGS. 8A to 8H, reference numeral 6 is a structure on which a plurality of parts to be connected are exposed, reference numerals 60a, 60b are a semiconductor device, reference numeral 600 is a semiconductor device sealed with a sealing resin, reference numeral 601 is an insulating base material, reference numeral 601a is a connecting terminal of an insulating base material (part to be connected), reference numeral 602 is a semiconductor chip, reference numeral 602a is a connecting terminal of a semiconductor chip (part to be connected), reference numerals 603, 613 are an insulating layer, reference numerals 604, 614 are a resin film, reference numerals 608, 618 are wiring, reference numeral 608a, 618a are a wiring main body section, reference numerals 608b, 618b are a wiring branch section, and reference numeral 609 is a sealing resin.

Figure 8A:
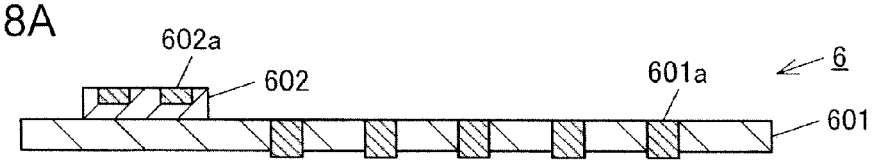
FIGS. 8A to 8H are step diagrams of a wiring method relating to a seventh embodiment of the present invention.

In the wiring method relating to the seventh embodiment, firstly, a structure 6 is prepared in which a semiconductor chip 602 is mounted on an insulating base material 601, as shown in FIG. 8A. A plurality of connecting terminals 601a are provided on a surface of the insulating base material 601 and a plurality of connecting terminals 602a are provided on a surface of the semiconductor chip 602. These connecting terminals 601a, 602a are exposed on the surface of the structure 6.

Figure 8B:
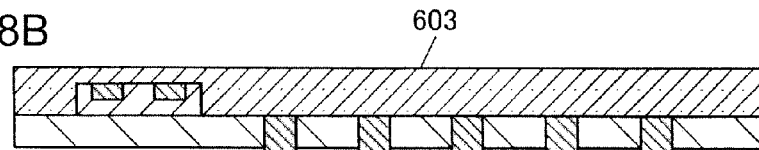

Next, as shown in FIG. 8B, an insulating layer 603 is formed on the surface of the structure 6 where the plurality of connecting terminals 601a, 602a are exposed (insulating layer forming step).

Figure 8C:
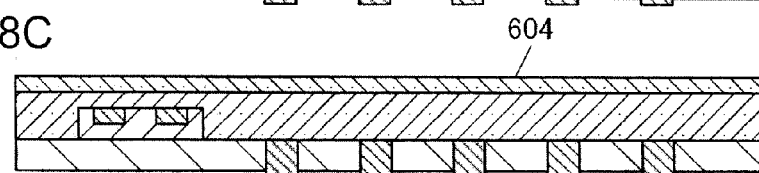

As shown in FIG. 8C, a resin film 604 is then Ruined on the surface of the insulating layer 603 (resin film forming step).

Figure 8D:
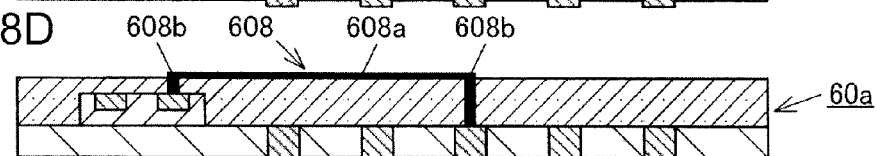

Similarly to the first embodiment, wiring 608 which includes a main body section 608a that is positioned on the surface of the insulating layer 603, and a branch section 608b that branches from the main body section 608a, extends inside the insulating layer 603 and reaches the connecting terminals 601a, 602a to be connected, is provided by carrying out a groove and hole forming step, a catalyst deposition step, a resin film removal step, and a plating step, as shown in FIG. 8D (wiring forming step).

In this way, a semiconductor device (a structure having wiring provided on a surface) 60a is obtained in which the semiconductor chip 602 is mounted on the insulating base material 601, and the connecting terminal 601a of the insulating base material 601 and the connecting terminal 602a of the semiconductor chip 602 are mutually connected by the wiring 608.

Figure 8E:
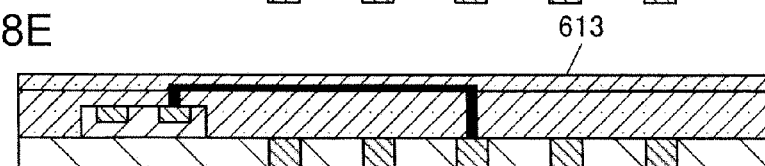

Next, as shown in FIG. 8E, a further insulating layer 613 is laminated onto the surface of the insulating layer 603 where the main body section 608a of the wiring 608 is exposed (insulating layer lamination step).

Figure 8F:
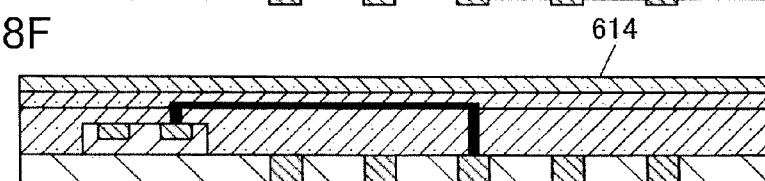

As shown in FIG. 8F, a resin film 614 is then formed on the surface of the laminated insulating layer 613 (resin film forming step).

Figure 8G:
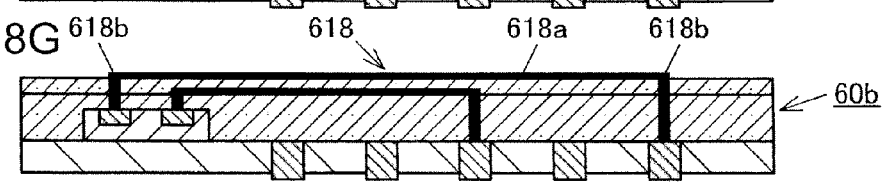

Thereupon, similarly to the first stage, wiring 618 which includes a main body section 618a that is positioned on the surface of the laminated insulating layer 613, and a branch section 618b that branches from the main body section 618a, extends inside the insulating layers 613, 603 and reaches the connecting terminals 601a, 602a to be connected, is provided by carrying out a groove and hole forming step, a catalyst deposition step, a resin film removal step, and a plating step, as shown in FIG. 8G (additional wiring forming step).

In this way, a semiconductor device (a structure having wiring provided on a surface) 60b is obtained in which the semiconductor chip 602 is mounted on the insulating base material 601, and the connecting terminals 601a of the insulating base material 601 and the connecting terminals 602a of the semiconductor chip 602 are mutually connected by the wiring 608, 618.

In this semiconductor device 60b, the insulating layer and the wiring are provided in two stages, an upper and a lower stage. More specifically, in the first stage, an insulating layer 603 is formed on the surface of a structure 6 in which the connecting terminal 601a of the insulating base material 601 and the connecting terminal 602a of the semiconductor chip 602 are exposed, the main body section 608a of the wiring 608 is provided on the surface of this insulating layer 603, a branch section 608b of the wiring 608 branches from this wiring main body section 608a, and the wiring branch section 608b extends inside the insulating layer 603 and reaches the connecting terminal 601a of the insulating base material 601 and the connecting terminal 602a of the semiconductor chip 602. In the second stage, a second-stage insulating layer 613 is laminated on the surface of the first-stage insulating layer 603 on which the first-stage wiring main body section 608a is exposed, a main body section 618a of second-stage wiring 618 is provided on the surface of this laminated second-stage insulating layer 613, a branch section 618b of the wiring 618 branches from this second-stage wiring main body section 618a, and this second-stage wiring branch section 618b extends inside the second-stage insulating layer 613 and the first-stage insulating layer 603, and reaches the connecting terminal 601a of the insulating base material 601 and the connecting terminal 602a of the semiconductor chip 602.

Since the connecting terminals 601a, 602a are covered by the insulating layers 603, 613, and the main body sections 608a, 618a of the wiring 608, 618 are provided on the surfaces of the insulating layers 603, 613, then even if there are other connecting terminals 601a, 602a between the target connecting terminals 601a and 602a that are to be mutually connected, it is not necessary to divert the wiring 608, 618 so as to avoid contact with the other connecting terminals 601a, 602a. The wiring 608, 618 can ride over, overlap with and pass the other connecting terminals 601a, 602a which are not to be connected. As a result of this, obstruction of the achievement of higher density of the wiring circuit is suppressed.

Figure 8H:
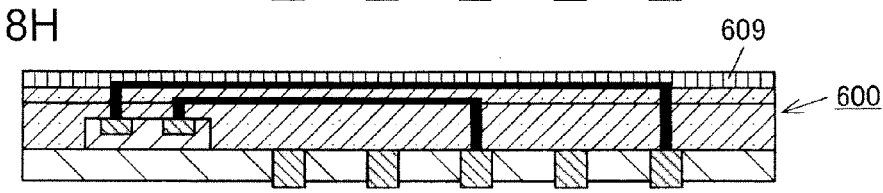

Next, as shown in FIG. 8H, the semiconductor device 60b is sealed with sealing resin 609. In this way, a semiconductor device 600 sealed with sealing resin 609 is achieved.

The wiring 618 is formed so as to lie flat against the surface of the insulating surface 613. Consequently, when the structure having wiring 618 provided on a surface thereof (the semiconductor device 60b) is inserted into a die and sealed with sealing resin 609, it is possible to prevent the wiring 618 from receiving pressure from the sealing resin 609 and hence receiving a large load. As a result of this, shorting, disconnection and damage of the wiring 618 is suppressed, and the productivity and reliability of the semiconductor device is improved, compared to a semiconductor device which is wire bonded by metal wires, or the like.

In the semiconductor devices 60b, 600 obtained in this seventh embodiment, the wirings 608, 618 can be mutually overlapping or pass each other. As a result of this, it is possible to cause the wirings 608, 618 to intersect with each other without giving rise to shorting, and from this viewpoint, the obstruction of achievement of higher density of the wiring circuit can be suppressed yet further.

In this seventh embodiment, the number of repetitions of the insulating layer lamination step and the additional wiring forming step is one repetition (a two-stage composition), but it is also possible to have two or more repetitions (a composition having three stages or more).

<Eighth Embodiment>

Figure 9:
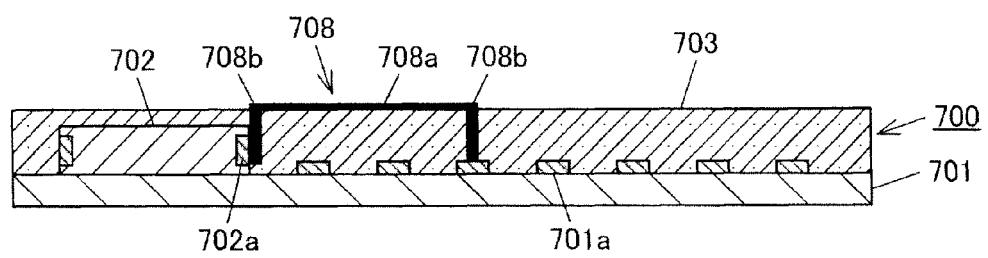
FIG. 9 is a vertical cross-sectional diagram of a wiring board relating to an eighth embodiment of the present invention.

A wiring method relating to an eighth embodiment of the present invention is now described with reference to FIG. 9. In FIG. 9, reference numeral 700 is a wiring board, reference numeral 701 is a printed wiring board, reference numeral 701a is a connecting terminal of the printed wiring board (part to be connected), reference numeral 702 is a semiconductor device, reference numeral 702a is a connecting terminal of a semiconductor device (part to be connected), reference numeral 703 is an insulating layer, reference numeral 708 is a wiring, reference numeral 708a is a wiring main body section and reference numeral 708b is a wiring branch section. Furthermore, only a portion of the wiring 708 is depicted.

The semiconductor device 700 relating to the eighth embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. More specifically, in the wiring board 700 relating to the eighth embodiment, an insulating layer 703 is formed on a surface of a structure in which a semiconductor device 702 is mounted on a printed wiring board 701, and connecting terminals 701a provided on the printed wiring board 701 and connecting terminals 702a provided on the semiconductor device 702 are exposed, and main body sections 708a of wiring 708 are provided on a surface of this insulating layer 703, branch sections 708b of the wiring 708 branch from these wiring main sections 708a, and these wiring branch sections 708b extend inside the insulating layer 703 and reach the connecting terminals 701a of the printed wiring board 701 and/or the connecting terminals 702a of the semiconductor device 702.

Since the connecting terminals 701a, 702a are covered by the insulating layer 703, and the main body section 708a of the wiring 708 is provided on the surface of the insulating layer 703, then even if there are other connecting terminals 701a, 702a between the target connecting terminals 701a and 702a that are to be mutually connected, it is not necessary to divert the wiring 708 so as to avoid contact with the other connecting terminals 701a, 702a. The wiring 708 can ride over, overlap with and pass the other connecting terminals 701a, 702a which are not to be connected. As a result of this, obstruction of the achievement of higher density of the wiring circuit is suppressed.

<Ninth Embodiment>

Figure 10:
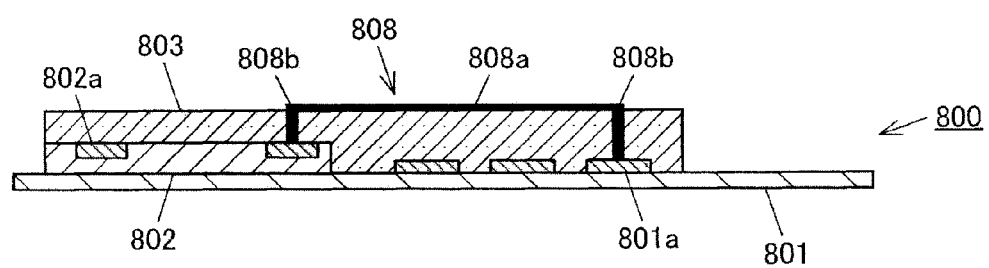
FIG. 10 is a vertical cross-sectional diagram of a memory relating to a ninth embodiment of the present invention.

A memory card relating to a ninth embodiment of the present invention is now described with reference to FIG. 10. In FIG. 10, reference numeral 800 is a memory card, reference numeral 801 is a supporting body, reference numeral 801a is a connecting terminal of the supporting body (part to be connected), reference numeral 802 is a memory package, reference numeral 802a is a connecting terminal of a memory package (part to be connected), reference numeral 803 is an insulating layer, reference numeral 808 is wiring, reference numeral 808a is a wiring main body section and reference numeral 808b is a wiring branch section. Furthermore, only a portion of the wiring 808 is depicted.

The memory card 800 relating to the ninth embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. More specifically, in the memory card 800 relating to the ninth embodiment, an insulating layer 803 is formed on a surface of a structure in which a memory package 802 is mounted on a supporting body 801, and connecting terminals 801a provided on the supporting body 801 and connecting terminals 802a provided on the memory package 802 are exposed, and main body sections 808a of wiring 808 are provided on a surface of this insulating layer 803, branch sections 808b of the wiring 808 branch from these wiring main sections 808a, and these wiring branch sections 808b extend inside the insulating layer 803 and reach the connecting terminals 801a of the supporting body 801 and/or the connecting terminals 802a of the memory package 802.

Since the connecting terminals 801a, 802a are covered by the insulating layer 803, and the main body section 808a of the wiring 808 is provided on the surface of the insulating layer 803, then even if there are other connecting terminals 801a, 802a between the target connecting terminals 801a and 802a that are to be mutually connected, it is not necessary to divert the wiring 808 so as to avoid contact with the other connecting terminals 801a, 802a. The wiring 808 can ride over, overlap with and pass the other connecting terminals 801a, 802a which are not to be connected. As a result of this, obstruction of the achievement of higher density of the wiring circuit is suppressed.

<Tenth Embodiment>

Figure 11:
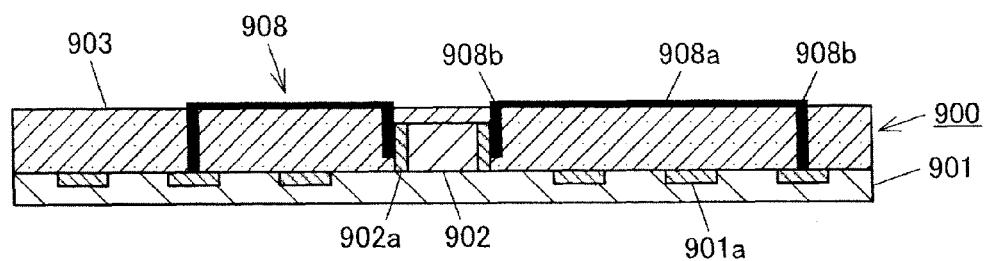
FIG. 11 is a vertical cross-sectional diagram of an electric device relating to a tenth embodiment of the present invention.

A wiring device relating to a tenth embodiment of the present invention is now described with reference to FIG. 11. In FIG. 11, reference numeral 900 is a wiring device, reference numeral 901 is an insulating base material, reference numeral 901a is a connecting terminal of the insulating base material (part to be connected), reference numeral 902 is a passive element, reference numeral 902a is a connecting terminal of a passive element (part to be connected), reference numeral 903 is an insulating layer, reference numeral 908 is wiring, reference numeral 908a is a wiring main body section and reference numeral 908b is a wiring branch section. Furthermore, only a portion of the wiring 908 is depicted.

The semiconductor device 900 relating to the tenth embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. More specifically, in the electric device 900 relating to the tenth embodiment, an insulating layer 903 is formed on a surface of a structure in which a passive element 902 is installed on an insulating base material 901, and connecting terminals 901a provided on the insulating base material 901 and connecting terminals 902a provided on the passive element 902 are exposed, and main body sections 908a of wiring 908 are provided on a surface of this insulating layer 903, branch sections 908b of the wiring 908 branch from these wiring main sections 908a, and these wiring branch sections 908b extend inside the insulating layer 903 and reach the connecting terminals 901a of the insulating base material 901 and/or the connecting terminals 902a of the passive element 902.

Since the connecting terminals 901a, 902a are covered by the insulating layer 903, and the main body section 908a of the wiring 908 is provided on the surface of the insulating layer 903, then even if there are other connecting terminals 901a, 902a between the target connecting terminals 901a and 902a that are to be mutually connected, it is not necessary to divert the wiring 908 so as to avoid contact with the other connecting terminals 901a, 902a. The wiring 908 can ride over, overlap with and pass the other connecting terminals 901a, 902a which are not to be connected. As a result of this, obstruction of the achievement of higher density of the wiring circuit is suppressed.

<Eleventh Embodiment>

Figure 12:
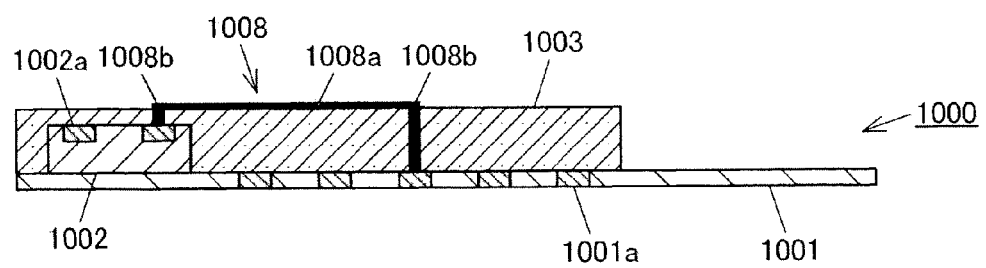
FIG. 12 is a vertical cross-sectional diagram of a module relating to an eleventh embodiment of the present invention.

A module relating to an eleventh embodiment of the present invention is now described with reference to FIG. 12. In FIG. 12, reference numeral 1000 is a module, reference numeral 1001 is a supporting body, reference numeral 1001a is a connecting terminal of the supporting body (part to be connected), reference numeral 1002 is an electric device, reference numeral 1002a is a connecting terminal of an electric device (part to be connected), reference numeral 1003 is an insulating layer, reference numeral 1008 is a wiring, reference numeral 1008a is a wiring main body section and reference numeral 1008b is a wiring branch section. Furthermore, only a portion of the wiring 1008 is depicted.

The module 1000 relating to the eleventh embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. More specifically, in the module 1000 relating to the eleventh embodiment, an insulating layer 1003 is formed on a surface of a structure in which an electric device 1002 is mounted on a supporting body 1001, and connecting terminals 1001a provided on the supporting body 1001 and connecting terminals 1002a provided on the electric device 1002 are exposed, and main body sections 1008a of wiring 1008 are provided on a surface of this insulating layer 1003, branch sections 1008b of the wiring 1008 branch from these wiring main sections 1008a, and these wiring branch sections 1008b extend inside the insulating layer 1003 and reach the connecting terminals 1001a of the supporting body 1001 and/or the connecting terminals 1002a of the electric device 1002.

Since the connecting terminals 1001a, 1002a are covered by the insulating layer 1003, and the main body section 1008a of the wiring 1008 is provided on the surface of the insulating layer 1003, then even if there are other connecting terminals 1001a, 1002a between the target connecting terminals 1001a and 1002a that are to be mutually connected, it is not necessary to divert the wiring 1008 so as to avoid contact with the other connecting terminals 1001a, 1002a. The wiring 1008 can ride over, overlap with and pass the other connecting terminals 1001a, 1002a which are not to be connected. As a result of this, obstruction of the achievement of higher density of the wiring circuit is suppressed.

<Twelfth Embodiment>

Figure 13:
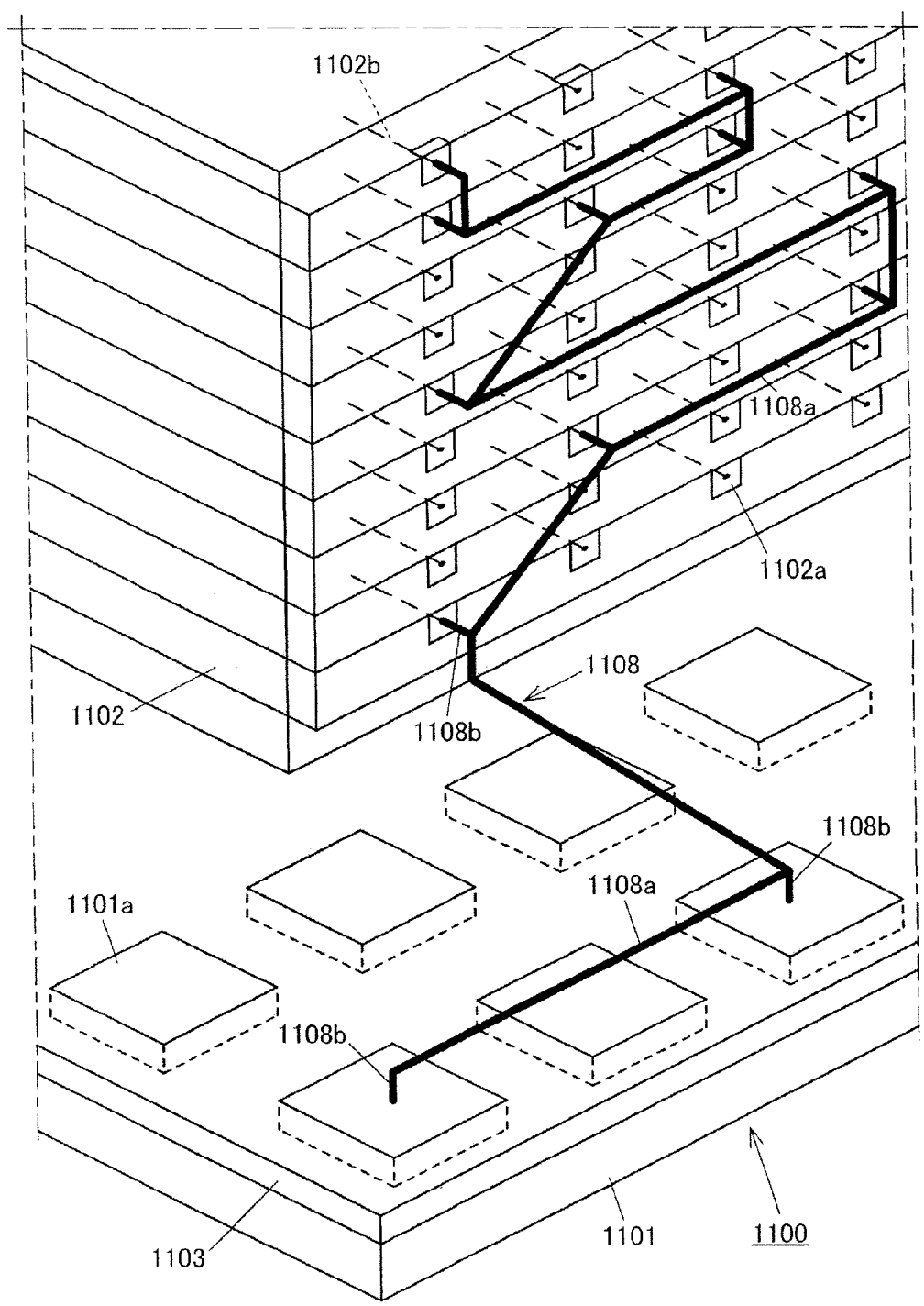
FIG. 13 is a partial transparent perspective diagram of a multilayer circuit board relating to a twelfth embodiment of the present invention.

A multilayer circuit board relating to a twelfth embodiment of the present invention is now described with reference to FIG. 13. In FIG. 13, reference numeral 1100 is a multilayer circuit board, reference numeral 1101 is a bottommost layer circuit board, reference numeral 1101a is a connecting terminal of the bottommost layer circuit board (part to be connected), reference numeral 1102 is a circuit board of a second layer or above, reference numeral 1102a is a connecting terminal of a circuit board of a second layer or above (part to be connected), reference numeral 1102b is an internal circuit of a circuit board of a second layer or above, reference numeral 1103 is an insulating layer, reference numeral 1108 is wiring, reference numeral 1108a is a wiring main body section and reference numeral 1108b is a wiring branch section. Furthermore, only a portion of the wiring 1108 is depicted.

The multilayer circuit board 1100 relating to the twelfth embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. In other words, in the multilayer circuit board 1100 relating to the twelfth embodiment, an insulating layer 1103 is formed on a surface of a structure in which a plurality of circuit boards 1101, 1102 are joined in a multi-level stacked state, and connecting terminals 1101a, 1102a provided in the circuit boards 1101, 1102 are exposed, main body sections 1108a of wiring 1108 are provided on the surface of this insulating layer 1103, branch sections 1108b of the wiring 1108 branch from the wiring main body sections 1108a, and these wiring branch sections 1108b extend inside the insulating layer 1103 and reach the connecting terminals 1101a, 1102a of respectively different circuit boards 1101, 1102. The connecting terminals 1102a of the circuit board 1102 are end portions of the internal circuits 1102b of the circuit board 1102.

Since the connecting terminals 1101a, 1102a are covered by the insulating layer 1103, and the main body sections 1108a of the wiring 1108 are provided on the surface of the insulating layer 1103, then even if there are other connecting terminals 1101a, 1102a between the target connecting terminals 1101a and 1102a that are to be mutually connected, it is not necessary to divert the wiring 1108 so as to avoid contact with the other connecting terminals 1101a, 1102a. The wiring 1108 can ride over, overlap with and pass the other connecting terminals 1101a, 1102a which are not to be connected. As a result of this, obstruction of the achievement of higher density of the wiring circuit is suppressed.

According to the multilayer circuit board 1100 having a composition of this kind, the wiring 1108 functions as external wiring for connecting between layers. In other words, a known technique for connecting between layers in a multilayer circuit board 1100 is forming via holes as holes for connecting between layers. However, since the via holes are arranged on the internal circuit of the multilayer circuit board 1100 then there is a problem in that the effective wiring surface area of the internal circuit is reduced by the arrangement space of the via holes. In the multilayer circuit board 1100 relating to this twelfth embodiment, the wiring 1108 which passes along the vertical walls of the side surfaces of the multilayer circuit board 1100 connects between the layers of the multilayer circuit board 1100, and therefore this problem can be avoided. Furthermore, it is also possible readily to provide external wiring 1108 for connecting between the layers in the vertical walls of the multilayer circuit board 1100.

As shown in FIG. 13, in order that the wiring 1108 which passes along the vertical walls of the side surfaces of the multilayer circuit board 1100 connects with the internal circuit 1102b of each layer, the wiring 1108 may be diverted, or pass obliquely through the vertical walls, or pass along the vertical walls so as not to be connected with the internal circuit of a prescribed layer.

Furthermore, the reference numeral 1101 may be a board which is separate and independent of the multilayer circuit board.

<Thirteenth Embodiment>

Figure 14:
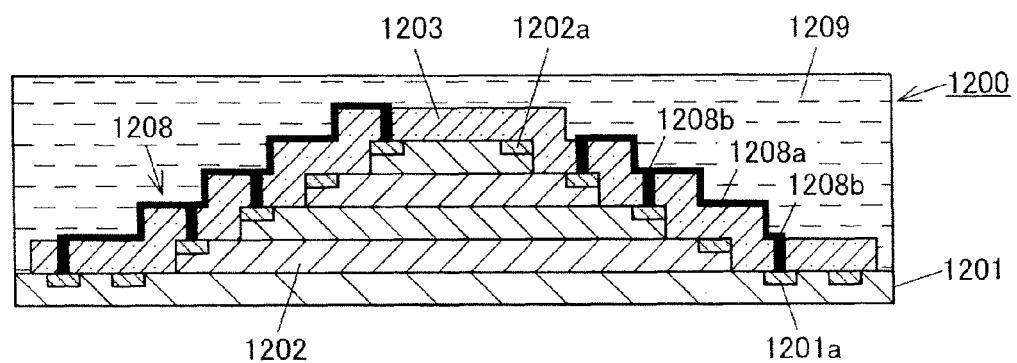
FIG. 14 is a vertical cross-sectional diagram of a semiconductor device relating to a thirteenth embodiment of the present invention.

A wiring method relating to a thirteenth embodiment of the present invention is now described with reference to FIG. 14. In FIG. 14, reference numeral 1200 is a semiconductor device (stacked chip package), reference numeral 1201 is an insulating base material, reference numeral 1201a is a connecting terminal of the semiconductor chip (part to be connected), reference numeral 1202 is a semiconductor chip, reference numeral 1202a is a connecting terminal of a semiconductor chip (part to be connected), reference numeral 1203 is an insulating layer, reference numeral 1208 is wiring, reference numeral 1208a is a wiring main body section, reference numeral 1208b is a wiring branch section and reference numeral 1209 is sealing resin. Furthermore, only a portion of the wiring 1208 is depicted.

The semiconductor device (stacked chip package) 1200 relating to the thirteenth embodiment has a similar composition to the semiconductor devices 100, 200 obtained in the first embodiment or the second embodiment, the structure 300 obtained in the third embodiment or the fourth embodiment, and semiconductor devices 400, 500 obtained in the fifth embodiment or the sixth embodiment. In other words, in the semiconductor device 1200 relating to the thirteenth embodiment, an insulating layer 1203 is formed on a surface of a structure in which a plurality of semiconductor chips 1202 are joined in a multi-level stacked state on insulating base material 12014, and connecting terminals 1202a provided on the semiconductor chips 1202 are exposed, main body sections 1208a of wiring 1208 are provided on the surface of this insulating layer 1203, branch sections 1208b of the wiring 1208 branch from the wiring main body sections 1208a, and these wiring branch sections 1208b extend inside the insulating layer 1203 and reach the connecting terminals 1202a of respectively different semiconductor chips 1202.

FIG. 14 shows an example in which wiring 1208 is also connected to the connecting terminals 1201a of the insulating base material 1201.

Since the connecting terminals 1201a, 1202a are covered by the insulating layer 1203, and the main body sections 1208a of the wiring 1208 are provided on the surface of the insulating layer 1203, then even if there are other connecting terminals 1201a, 1202a between the target connecting terminals 1201a and 1202a that are to be mutually connected, it is not necessary to divert the wiring 1208 so as to avoid contact with the other connecting terminals 1201a, 1202a. The wiring 1208 can ride over, overlap with and pass the other connecting terminals 1201a, 1202a which are not to be connected. As a result of this, obstruction of the achievement of higher density of the wiring circuit is suppressed.

The wiring 1208 is formed so as to lie flat against the surface of the insulating surface 1203. Consequently, when the structure having wiring 1208 provided on a surface thereof (the semiconductor device) is inserted into a die and sealed with sealing resin 1209, it is possible to prevent the wiring 1208 from receiving pressure from the sealing resin 1209 and hence receiving a large load. As a result of this, shorting, disconnection and damage of the wiring 1208 is suppressed, and the productivity and reliability of the semiconductor device is improved, compared to a semiconductor device which is wire bonded by metal wires, or the like.

In this thirteenth embodiment, the semiconductor device 1200 is a stacked chip package aimed at achieving even more compact size and higher density in the field of multichip modules. External wiring 1208 for connecting between chips is formed on the surfaces of the stacked chip package 1200, in other words, the upper surface and shelf surfaces (step surfaces), and side faces (vertical walls) of the insulating layer 1203.

According to a stacked chip package 1200 having a composition of this kind, the wiring 1208 functions as external wiring for connecting between chips, instead of a conventional through silicon via method or a multi-step wire bonding method. More specifically, a conventional through silicon via method or a multi-step wire bonding method are known as methods for connecting between chips in a stacked chip package 1200 in which a plurality of semiconductor chips 1202 are stacked in multiple levels. However, with through silicon vias, since the vias are arranged on the circuitry of the semiconductor chips 1202, then there is a problem in that the effective wiring surface area of the circuit in the chip 1202 is reduced by the arrangement space of the vias. Furthermore, in multi-layer wire bonding, as described above, the metal wires receive pressure from the sealing resin when sealed in resin, causing productivity and reliability to decline, and furthermore the mounting surface area becomes larger and higher density cannot be achieved. In a stacked chip package 1200 according to this thirteenth embodiment, since external wiring 1208 for connecting between chips is formed on the surface of the stacked chip package 1200, in other words, the surface of the insulating layer 1203, and this external wiring 1208 provides connection between the plurality of chips 1202 which constitute the stacked chip package 1200, via the wiring branch sections 1208b, then the aforementioned problems can be avoided.

The present specification has disclosed various embodiments as described above. The principle embodiments disclosed by the present specification are summarized below.

Firstly, the invention discloses a wiring method for mutually connecting by wiring a plurality of parts to be connected which are exposed on a surface of a structure, the method including: an insulating layer forming step of forming an insulating layer on a surface of the structure where the plurality of parts to be connected are exposed; and a wiring forming step of providing wiring having a main body section which is positioned on a surface of the insulating layer and a branch section which branches from the main body section, extends inside the insulating layer, and reaches a part to be connected of a connection object.

According to this embodiment, if a plurality of parts to be connected which are exposed on the surface of the structure are mutually connected by wiring, it is not necessary to divert the wiring and obstruction of the achievement of higher density in the wiring circuit is suppressed.

Furthermore, shorting, disconnection or damage of the wiring due to the pressure of sealing resin when the structure is sealed with sealing resin, is suppressed.

Moreover, an embodiment is also disclosed according to which, in the wiring method described above, the wiring forming step further includes: a resin film forming step of forming a resin film on a surface of the insulating layer; a groove and hole forming step of forming a groove having a depth equal to or exceeding a thickness of the resin film from a surface side of the resin film so that this groove passes in the vicinity of a part to be connected of a connection object, and also forming a communicating hole which reaches the part to be connected of a connection object, from the portion where the groove passes in the vicinity thereof; a catalyst deposition step of depositing a plating catalyst or plating catalyst precursor on a surface of the groove and the communicating hole; a resin film removal step of removing the resin film by dissolving or swelling this film; and a plating step of forming a plating film only on a portion where the plating catalyst or a plating catalyst formed from the plating catalyst precursor remains, by carrying out electroless plating.

According to this embodiment, it is possible to maintain the outline of the wiring, and in particular, the wiring main body section, with high accuracy, and the occurrence of shorting and migration is suppressed.

Furthermore, an embodiment is also disclosed in which, in the wiring method described above, the wiring forming step further includes: an electroplating step of thickening the plating film by carrying out electroplating after the plating step.

According to this embodiment, the time taken to thicken the plating film can be shortened.

An embodiment is also disclosed according to which, in the wiring method described above, the resin film contains a fluorescent material; and the wiring forming step further includes: an inspection step of inspecting for resin film removal defects by using fluorescent light from the fluorescent material, after the resin film removal step and before the plating step.

According to this embodiment, by removing a portion where light emission is detected, the formation of a plating film on this portion is suppressed and the occurrence of shorting can be prevented in advance.

An embodiment is also disclosed according to which, the wiring method described above further includes: an insulating layer laminating step of further laminating an insulating layer on a surface of the insulating layer where the main body section of the wiring is exposed, after the wiring forming step; and an additional wiring forming step of providing wiring having a main body section which is positioned on a surface of the laminated insulating layer and a branch section which branches from the main body section, extends inside the insulating layer and reaches a part to be connected of a connection object; the insulating layer laminating step and the additional wiring forming step being repeated at least once.

According to this embodiment, since wirings can pass each other by overlapping, it is possible for wirings to intersect without giving rise to shorting, and the obstruction of the achievement of higher density in the wiring circuit can be suppressed yet further.

Furthermore, the invention also discloses a structure having wiring provided on a surface; wherein an insulating layer is formed on a surface of a structure in which a plurality of parts to be connected are exposed; a wiring main body section is provided on a surface of the insulating layer; a wiring branch section branches from the wiring main body section; and the wiring branch section extends inside the insulating layer and reaches a part to be connection of a connection object.

According to this embodiment, if a plurality of parts to be connected which are exposed on the surface of the structure are mutually connected by wiring, it is not necessary to divert the wiring and obstruction of the achievement of higher density in the wiring circuit is suppressed.

Furthermore, shorting, disconnection or damage of the wiring due to the pressure of sealing resin when the structure is sealed with sealing resin, is suppressed.

An embodiment is also disclosed according to which, the structure described above further includes one or more levels of a composition, in which an insulating layer is laminated on a surface of the insulating layer where the wiring main body section is exposed; a wiring main body section is provided on a surface of this laminated insulating layer; a wiring branch section branches from the wiring main body section; and the wiring branch section extends inside the insulating layer and reaches a part to be connection of a connection object.

According to this embodiment, since wirings can pass each other by overlapping, it is possible for wirings to intersect without giving rise to shorting, and the obstruction of the achievement of higher density in the wiring circuit can be suppressed yet further.

Furthermore, the invention also discloses a semiconductor device, wherein an insulating layer is formed on a surface of a structure in which a semiconductor chip is mounted on an insulating base material and a connecting terminal provided on the insulating base material and a connecting terminal provided on the semiconductor chip are exposed; a wiring main body section is provided on a surface of the insulating layer; and a wiring branch section branches from the wiring main body section; and the wiring branch section extends inside the insulating layer and reaches a connecting terminal of the insulating base layer and/or a connecting terminal of the semiconductor chip.

According to this embodiment, if a plurality of connecting terminals which are exposed on the surface of the semiconductor device are mutually connected by wiring, it is not necessary to divert the wiring and obstruction of the achievement of higher density in the wiring circuit is suppressed.

Furthermore, shorting, disconnection or damage of the wiring due to the pressure of sealing resin when the semiconductor device is sealed with sealing resin, is suppressed.

Furthermore, the invention also discloses a wiring board, wherein an insulating layer is formed on a surface of a structure in which a semiconductor device is mounted on a printing wiring board and a connecting terminal provided on the printed wiring board and a connecting terminal provided on the semiconductor device are exposed; a wiring main body section is provided on a surface of the insulating layer; a wiring branch section branches from the wiring main body section; and the wiring branch section extends inside the insulating layer and reaches a connecting terminal of the printed wiring board and/or a connecting terminal of the semiconductor device.

According to this embodiment, if a plurality of connecting terminals which are exposed on the surface of the wiring board are mutually connected by wiring, it is not necessary to divert the wiring and obstruction of the achievement of higher density in the wiring circuit is suppressed.

Furthermore, the invention also discloses a memory card, wherein an insulating layer is formed on a surface of a structure in which a memory package is mounted on a supporting body and a connecting terminal provided on the supporting body and a connecting terminal provided on the memory package are exposed; a wiring main body section is provided on a surface of the insulating layer; a wiring branch section branches from the wiring main body section; and the wiring branch section extends inside the insulating layer and reaches a connecting terminal of the supporting body and/or a connecting terminal of the memory package.

According to this embodiment, if a plurality of connecting terminals which are exposed on the surface of the memory card are mutually connected by wiring, it is not necessary to divert the wiring and obstruction of the achievement of higher density in the wiring circuit is suppressed.

Furthermore, the invention also discloses an electric device, wherein an insulating layer is formed on a surface of a structure in which a passive element is mounted on an insulating base material and a connecting terminal provided on the insulating base material and a connecting terminal provided on the passive element are exposed; a wiring main body section is provided on a surface of the insulating layer; a wiring branch section branches from the wiring main body section; and the wiring branch section extends inside the insulating layer and reaches a connecting terminal of the insulating base layer and/or a connecting terminal of the passive element.

According to this embodiment, if a plurality of connecting terminals which are exposed on the surface of the electric device are mutually connected by wiring, it is not necessary to divert the wiring and obstruction of the achievement of higher density in the wiring circuit is suppressed.

Furthermore, the invention also discloses a module, wherein an insulating layer is formed on a surface of a structure in which an electric device is mounted on a supporting body and a connecting terminal provided on the supporting body and a connecting terminal provided on the electric device are exposed; a wiring main body section is provided on a surface of the insulating layer; a wiring branch section branches from the wiring main body section; and the wiring branch section extends inside the insulating layer and reaches a connecting terminal of the supporting body and/or a connecting terminal of the electric device.

According to this embodiment, if a plurality of connecting terminals which are exposed on the surface of the module are mutually connected by wiring, it is not necessary to divert the wiring and obstruction of the achievement of higher density in the wiring circuit is suppressed.

Furthermore, the invention also discloses a multilayer circuit board, wherein an insulating layer is formed on a surface of a structure in which a plurality of circuit boards are joined in a multi-level stacked state and connecting terminals provided on the circuit boards are exposed; a wiring main body section is provided on a surface of the insulating layer; a wiring branch section branches from the wiring main body section; the wiring branch section extends inside the insulating layer and reaches connecting terminals of respectively different circuit boards; and the connecting terminals of the circuit boards are end portions of internal circuits of the circuit boards.

According to this embodiment, if a plurality of connecting terminals which are exposed on the surface of the multilayer circuit board are mutually connected by wiring, it is not necessary to divert the wiring and obstruction of the achievement of higher density in the wiring circuit is suppressed.

Furthermore, the invention also discloses a semiconductor device, wherein an insulating layer is formed on a surface of a structure in which a plurality of semiconductor chips are mounted in a multi-level stacked state on an insulating base material and connecting terminals provided on the circuit semiconductor chips are exposed; a wiring main body section is provided on a surface of the insulating layer; a wiring branch section branches from the wiring main body section; and the wiring branch section extends inside the insulating layer and reaches connecting terminals of respectively different semiconductor chips.

According to this embodiment, if a plurality of connecting terminals which are exposed on the surface of the stacked chip package are mutually connected by wiring, it is not necessary to divert the wiring and obstruction of the achievement of higher density in the wiring circuit is suppressed.

Furthermore, shorting, disconnection or damage of the wiring due to the pressure of sealing resin when the stacked chip package is sealed with sealing resin, is suppressed.

Other actions and beneficial effects of the present embodiments have been described in the first to thirteenth embodiments.

In the present embodiments, in the groove and hole forming step, the groove has a depth equal to the thickness of the resin film, but instead of this, the groove may also be of a depth exceeding the thickness of the resin film. In this case, either a portion or all of the wiring main body section which is obtained by the plating step is embedded in the insulating layer. As a result of this, the bonding strength of the wiring with respect to the structure is improved and detachment or displacement of the wiring is suppressed.

This application is based on Japanese Patent Application No. 2010-115250 filed on 19 May 2010, the contents of which are incorporated herein.

Although embodiments of the present invention have been described in detail here, the descriptions given above are examples in all aspects, and the present invention is not limited to these examples. It is to be inferred that countless modifications which are not described here can be envisaged without departing from the scope of the present invention. In order to portray the present invention, the invention has been described sufficiently and appropriately above on the basis of embodiments, while referring to the drawings. However, a person skilled in the art will recognize that modifications and/or refinements can be made readily to the embodiment described above. Therefore, it is inferred that such modifications or refinements implemented by a person skilled in the art are included in the scope of rights stated in the claims, provided that these modifications or refinements do not depart from the scope of the claims.

INDUSTRIAL APPLICABILITY

According to the present invention, when mutually connecting, by wiring, a plurality of parts to be connected which are exposed on a surface of a structure, there is no need to divert the wiring and obstruction of the achievement of higher density in the wiring circuit is suppressed. Therefore, the present invention has broad industrial applicability in the field of structures having wiring provided on a surface thereof, such as a semiconductor device, for instance.

The invention claimed is:

1. A structure having wiring provided on a surface, wherein
an undulating insulating layer is formed on a surface of a structure in which a plurality of parts to be connected are exposed,
a wiring main body section is provided along a surface of the insulating layer
and a portion or all of the wiring main body section is embedded in the insulating layer,
a wiring branch section branches from the wiring main body section, and
the wiring branch section extends inside the insulating layer and reaches a part to be connected of a connection object.

2. The structure having wiring provided on a surface according to claim 1, further comprising one or more levels of a composition, in which:
a second undulating insulating layer is laminated on the surface of the insulating layer where the wiring main body section is provided;
a second wiring main body section is provided on a surface of this laminated second undulating insulating layer;
a second wiring branch section branches from the second wiring main body section; and
the second wiring branch section extends inside the insulating layers and reaches a part to be connection of a connection object.

3. A semiconductor device, wherein
an undulating insulating layer is formed on a surface of a structure in which a semiconductor chip is mounted on an insulating base material and a connecting terminal provided on the insulating base material and a connecting terminal provided on the semiconductor chip are exposed,
a wiring main body section is provided along a surface of the insulating layer and a portion or all of the wiring main body section is embedded in the insulating layer,
a wiring branch section branches from the wiring main body section, and
the wiring branch section extends inside the insulating layer and reaches a connecting terminal of the insulating base layer and/or a connecting terminal of the semiconductor chip.

4. A wiring board, wherein
an undulating insulating layer is formed on a surface of a structure in which a semiconductor device is mounted on a printing wiring board and a connecting terminal provided on the printed wiring board and a connecting terminal provided on the semiconductor device are exposed,
a wiring main body section is provided along a surface of the insulating layer and a portion or all of the wiring main body section is embedded in the insulating layer,
a wiring branch section branches from the wiring main body section, and
the wiring branch section extends inside the insulating layer and reaches a connecting terminal of the printed wiring board and/or a connecting terminal of the semiconductor device.

5. A memory card, wherein
an undulating insulating layer is formed on a surface of a structure in which a memory package is mounted on a supporting body and a connecting terminal provided on the supporting body and a connecting terminal provided on the memory package are exposed,
a wiring main body section is provided along a surface of the insulating layer and a portion or all of the wiring main body section is embedded in the insulating layer,
a wiring branch section branches from the wiring main body section, and
the wiring branch section extends inside the insulating layer and reaches a connecting terminal of the supporting body and/or a connecting terminal of the memory package.

6. An electric device, wherein
an undulating insulating layer is formed on a surface of a structure in which a passive element is mounted on an insulating base material and a connecting terminal provided on the insulating base material and a connecting terminal provided on the passive element are exposed,
a wiring main body section is provided along a surface of the insulating layer and a portion or all of the wiring main body section is embedded in the insulating layer,
a wiring branch section branches from the wiring main body section, and
the wiring branch section extends inside the insulating layer and reaches a connecting terminal of the insulating base material and/or a connecting terminal of the passive element.

7. A module, wherein
an undulating insulating layer is formed on a surface of a structure in which an electric device is mounted on a supporting body and a connecting terminal provided on the supporting body and a connecting terminal provided on the electric device are exposed,
a wiring main body section is provided along a surface of the insulating layer and a portion or all of the wiring main body section is embedded in the insulating layer, a wiring branch section branches from the wiring main body section, and the wiring branch section extends inside the insulating layer and reaches a connecting terminal of the supporting body and/or a connecting terminal of the electric device.

8. A multilayer circuit board, wherein an undulating insulating layer is formed on a surface of a structure in which a plurality of circuit boards are joined in a multi-level stacked state and connecting terminals provided on the circuit boards are exposed, a wiring main body section is provided along a surface of the insulating layer and a portion or all of the wiring main body section is embedded in the insulating layer;

a wiring branch section branches from the wiring main body section, the wiring branch section extends inside the insulating layer and reaches connecting terminals of respectively different circuit boards, and the connecting terminals of the circuit boards are end portions of internal circuits of the circuit boards.

9. A semiconductor device, wherein an undulating insulating layer is formed on a surface of a structure in which a plurality of semiconductor chips are mounted in a multi-level stacked state on an insulating base material and connecting terminals provided on the circuit semiconductor chips are exposed, a wiring main body section is provided along a surface of the insulating layer and a portion or all of the wiring main body section is embedded in the insulating layer, a wiring branch section branches from the wiring main body section, and the wiring branch section extends inside the insulating layer and reaches connecting terminals of respectively different semiconductor chips.

* * * * *